United States Patent
Lee et al.

(10) Patent No.: US 9,076,387 B1
(45) Date of Patent: Jul. 7, 2015

(54) DISPLAY DEVICE WITH ADC AND PIXEL COMPENSATION

(71) Applicant: LG DISPLAY CO., LTD., Seoul (KR)

(72) Inventors: DongYoun Lee, Gwangju (KR); JinHyoung Kim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/582,835

(22) Filed: Dec. 24, 2014

(30) Foreign Application Priority Data

Jul. 3, 2014 (KR) .......................... 10-2014-0082927

(51) Int. Cl.
*G09G 3/30* (2006.01)
*G09G 3/32* (2006.01)

(52) U.S. Cl.
CPC ............ *G09G 3/3258* (2013.01); *G09G 3/3291* (2013.01); *G09G 2300/08* (2013.01); *G09G 2310/027* (2013.01); *G09G 2320/0233* (2013.01)

(58) Field of Classification Search
CPC .............. G09G 2320/0285; G09G 2320/0295; G09G 2320/029; G09G 2320/043; G09G 2320/045; G09G 2320/0233; G09G 2310/027; G09G 2300/08; G09G 3/3291; G09G 3/3258; G09G 3/2927; G09G 3/2022; G09G 2300/0842; G09G 3/3233; G09G 3/3688; G09G 2320/041
USPC ........... 345/55, 61, 63, 76–78, 100, 101, 204, 345/215; 341/155; 315/169.3; 348/243
See application file for complete search history.

(56) References Cited

U.S. PATENT DOCUMENTS

| | | | |
|---|---|---|---|
| 7,746,252 B2 * | 6/2010 | Mizuta ........................... | 341/118 |
| 2002/0145584 A1 * | 10/2002 | Waterman ....................... | 345/98 |
| 2003/0202111 A1 * | 10/2003 | Park .............................. | 348/243 |
| 2005/0007392 A1 * | 1/2005 | Kasai et al. .................... | 345/690 |
| 2005/0093958 A1 * | 5/2005 | Mori et al. ..................... | 347/207 |
| 2007/0035498 A1 * | 2/2007 | Jeon ............................... | 345/92 |
| 2007/0046587 A1 * | 3/2007 | Takahara ........................ | 345/76 |
| 2008/0315788 A1 * | 12/2008 | Levey et al. ................... | 315/291 |
| 2009/0051628 A1 * | 2/2009 | Kwon ............................. | 345/77 |
| 2009/0160740 A1 * | 6/2009 | Leon et al. ..................... | 345/76 |
| 2009/0243498 A1 * | 10/2009 | Childs et al. ................. | 315/169.3 |
| 2010/0141667 A1 * | 6/2010 | Chiou et al. ................... | 345/536 |
| 2011/0007102 A1 * | 1/2011 | Ogura et al. ................... | 345/690 |
| 2011/0026643 A1 * | 2/2011 | Ruelke et al. .................. | 375/319 |
| 2011/0032281 A1 * | 2/2011 | Ietomi ........................... | 345/690 |
| 2011/0069059 A1 * | 3/2011 | Lee et al. ....................... | 345/212 |
| 2011/0199395 A1 * | 8/2011 | Nathan et al. ................. | 345/690 |
| 2012/0262318 A1 * | 10/2012 | Straayer et al. ............... | 341/120 |
| 2013/0135272 A1 * | 5/2013 | Park ............................... | 345/211 |
| 2014/0104155 A1 * | 4/2014 | Long et al. .................... | 345/107 |
| 2014/0253603 A1 * | 9/2014 | Kwon et al. ................... | 345/690 |

* cited by examiner

*Primary Examiner* — Lun-Yi Lao
*Assistant Examiner* — Ibrahim Khan
(74) *Attorney, Agent, or Firm* — McKenna Long & Aldridge LLP

(57) ABSTRACT

A display device includes a display panel having data lines, gate lines and a plurality of subpixels. Each of the plurality of subpixels are defined by the data lines and the gate lines, and each of the plurality of subpixels includes a circuit having a transistor. A plurality of Digital Integrated Circuits (DICs) where a digital to analog converter (DAC) is disposed within each of the plurality of DICs. An analog to digital converter (ADC) is disposed within each of the plurality of DICS, where the ADC disposed in each of the plurality of DICs includes a plurality of sensing channels. The display device includes a pixel compensation circuit to compensate a characteristic of the transistor within each of the plurality of subpixels and an ADC compensation circuit to compensate a characteristic of the ADC within each of the plurality of DICs.

20 Claims, 29 Drawing Sheets

FIG.23A

| | 4X3840 | | | | | | | |
|---|---|---|---|---|---|---|---|---|
| | R1 | W1 | G1 | B1 | R1 | W1 | G1 | B1 | ••• |
| | R2 | W2 | G2 | B2 | R2 | W2 | G2 | B2 | ••• |
| 2160 | R3 | W3 | G3 | B3 | R3 | W3 | G3 | B3 | ••• |
| | ⋮ | ⋮ | ⋮ | ⋮ | ⋮ | ⋮ | ⋮ | ⋮ | ⋱ |

FIG.23B $$2160 \left\{ \begin{array}{l} \text{(R1)}(RTDS) \rightarrow W1 \ (RT) \rightarrow G1 \ (RT) \rightarrow B1 \ (RT) \\ \rightarrow R2 \ (RT) \rightarrow \text{(W2)}(RTDS) \rightarrow G2 \ (RT) \rightarrow B2 \ (RT) \\ \rightarrow R3 \ (RT) \rightarrow W3 \ (RT) \rightarrow \text{(G3)}(RTDS) \rightarrow B3 \ (RT) \\ \rightarrow R4 \ (RT) \rightarrow W4 \ (RT) \rightarrow G4 \ (RT) \rightarrow \text{(B4)}(RTDS) \\ \vdots \end{array} \right.$$

FIG.23C (R1)(RTDS) → R2 (RT)→ R3 (RT)→ R4 (RT) → • • •
→ W1 (RT) →(W2)(RTDS)→ W3 (RT)→ W4 (RT) → • • •
→ G1 (RT) → G2 (RT)→(G3)(RTDS)→ G4 (RT) → • • •
→ B1 (RT) → B2 (RT)→ B3 (RT)→(B4)(RTDS) → • • •

—— 2160 ——

US 9,076,387 B1

DISPLAY DEVICE WITH ADC AND PIXEL COMPENSATION

CROSS-REFERENCE TO RELATED APPLICATION

The present application claims priority under 35 U.S.C. §119(a) of Korean Patent Application No. 10-2014-0082927 filed on Jul. 3, 2014, the contents of which are incorporated by reference for all purposes as if set forth herein.

BACKGROUND OF THE INVENTION

1. Field of the Invention

The present invention relates to a display device.

2. Background of the Related Art

In response to the growth of the information society, there is increasing demand for various types of display devices to display images. Various display devices such as liquid crystal displays (LCDs), plasma display panels (PDPs) and organic light-emitting diode (OLED) display devices are currently used.

Such display devices include a display panel on which data lines and gate lines intersect each other and subpixels are defined at the intersection points of the data lines and the gate lines. The display device further includes a data driver supplying data signals to the data lines and a gate driver supplying gate signals to the gate lines.

A transistor is disposed in each of the subpixels defined on the display panel. The characteristics of the transistor within each subpixel may change according to the operation time or may differ from that of the transistor within the other subpixel. In addition, when the display device is an OLED display device, OLEDs in the subpixels may deteriorate at different rates. This phenomenon may cause non-uniform luminance in the subpixels, thereby degrading image quality.

Therefore, in order to address the issue of non-uniform luminance of the subpixels, pixel compensation technology for compensating for a change or difference in the characteristics of devices (e.g. a transistor or an OLED) within circuits has been proposed.

This pixel compensation technology is a technology intended to prevent or reduce the incidence of non-uniformity in terms of the luminance between subpixels by sensing specific nodes of circuits within the subpixels and changing data supplied to each of the subpixels based on the sensing results.

However, although this pixel compensation function is provided, a phenomenon in which the luminance of each subpixel is not compensated or the difference in the levels of luminance between the subpixels is not compensated may remain.

SUMMARY OF THE INVENTION

Various aspects of the present invention are intended to overcome the problem in that the luminance of each subpixel is not compensated or the difference in the levels of luminance between subpixels is not compensated although the pixel compensation function is provided.

According to the present invention as set forth above, it is possible to overcome the problem in that the luminance of each subpixel is not compensated or the difference in the levels of luminance between the subpixels is not compensated although the pixel compensation function is provided.

In addition, according to the present invention, although the result of sensing the sensing nodes within each subpixel is not accurate, the sensing result is compensated, thereby making the pixel compensation using the sensing result be accurate. This can consequently prevent or reduce the non-uniformity of luminance, thereby improving the image quality of the display device.

Furthermore, according to the present invention, the ADC compensation technology capable of compensating for a change in the ADC characteristic is provided. When the characteristics of the ADC corresponding to the sensing unit has changed, the pixel compensation using the ADC sensing result.

In addition, according to the present invention, the ADC compensation function efficiently compensates for a change in the ADC characteristic according to data driver integrated circuits (DICs) when the ADC characteristic has changed.

Furthermore, according to the present invention, the ADC compensation function accurately compensates for a change in the ADC characteristic according to the sensing channels when the ADC characteristic has changed.

In one aspect, a display device comprises a display panel having data lines, gate lines and a plurality of subpixels, wherein each of the plurality of subpixels are defined by the data lines and the gate lines, and each of the plurality of subpixels includes a circuit having a transistor; a plurality of Digital Integrated Circuits (DICs); a digital to analog converter (DAC) disposed within each of the plurality of DICs; an analog to digital converter (ADC) disposed within each of the plurality of DICS, wherein the ADC disposed in each of the plurality of DICs includes a plurality of sensing channels; a memory having a lookup table (LUT); a timing controller, wherein the timing controller changes data supplied to the subpixels according to the LUT; a pixel compensation circuit to compensate a characteristic of the transistor within each of the plurality of subpixels; and an ADC compensation circuit to compensate a characteristic of the ADC within each of the plurality of DICs.

In another aspect a method of driving a display device having a display panel having data lines, gate lines and a plurality of subpixels, wherein each of the plurality of subpixels are defined by the data lines and the gate lines, and each of the plurality of subpixels includes a circuit having a transistor; a plurality of Digital Integrated Circuits (DICs); a digital to analog converter (DAC) disposed within each of the plurality of DICs; an analog to digital converter (ADC) disposed within each of the plurality of DICs, wherein the ADC disposed in each of the plurality of DICs includes a plurality of sensing channels; a memory having a lookup table (LUT); a timing controller, wherein the timing controller changes data supplied to the subpixels according to the LUT; a pixel compensation circuit to compensate a characteristic of the transistor within each of the plurality of subpixels; and an ADC compensation circuit to compensate a characteristic of the ADC within each of the plurality of DICs, the method comprises updating the LUT to include ADC characteristic information according to each of the plurality of sensing channels, wherein the ADC characteristic information includes offset and gain; updating the LUT to include a Reference Data Average, wherein the Reference Data Average is calculated by sensing the ADC reference data according to each of the plurality of sensing channels and averaging the sensed ADC reference data; compensating a mobility of the transistor within each of the plurality of subpixels in real time; compensating a characteristic of each ADC disposed within each of the plurality of DICs; compensating a threshold voltage of the transistor within each of the plurality of subpixels.

In another aspect a method of driving a display device having a display panel having data lines, gate lines and a plurality of subpixels, wherein each of the plurality of subpixels are defined by the data lines and the gate lines, and each of the plurality of subpixels includes a circuit having a transistor; a plurality of Digital Integrated Circuits (DICs); a digital to analog converter (DAC) disposed within each of the plurality of DICs; an analog to digital converter (ADC) disposed within each of the plurality of DICs, wherein the ADC disposed in each of the plurality of DICs includes a plurality of sensing channels; a memory having a lookup table (LUT); a timing controller, wherein the timing controller changes data supplied to the subpixels according to the LUT; a pixel compensation circuit to compensate a characteristic of the transistor within each of the plurality of subpixels; and an ADC compensation circuit to compensate a characteristic of the ADC within each of the plurality of DICs, the method comprises: sensing ADC reference data for each of the plurality of sensing channels of each ADC disposed in each of the plurality of DICs; compensating a mobility of the transistor within each of the plurality of subpixels in real time; compensating a characteristic of each ADC sensing channel disposed within each of the plurality of DICs; compensating a threshold voltage of the transistor within each of the plurality of subpixels.

It is to be understood that both the foregoing general description and the following detailed description of embodiments of the present invention are exemplary and explanatory and are intended to provide further explanation of the invention as claimed.

BRIEF DESCRIPTION OF THE DRAWINGS

The above and other objects, features and advantages of the present invention will be more clearly understood from the following detailed description when taken in conjunction with the accompanying drawings, in which:

FIG. 23A to FIG. 23C are diagrams illustrating the sequence of sensing for the ADC compensation and sensing for the pixel compensation in consideration of the colors of the subpixels in the display device according to an exemplary embodiment.

DETAILED DESCRIPTION OF THE ILLUSTRATED EMBODIMENTS

Figure 1:
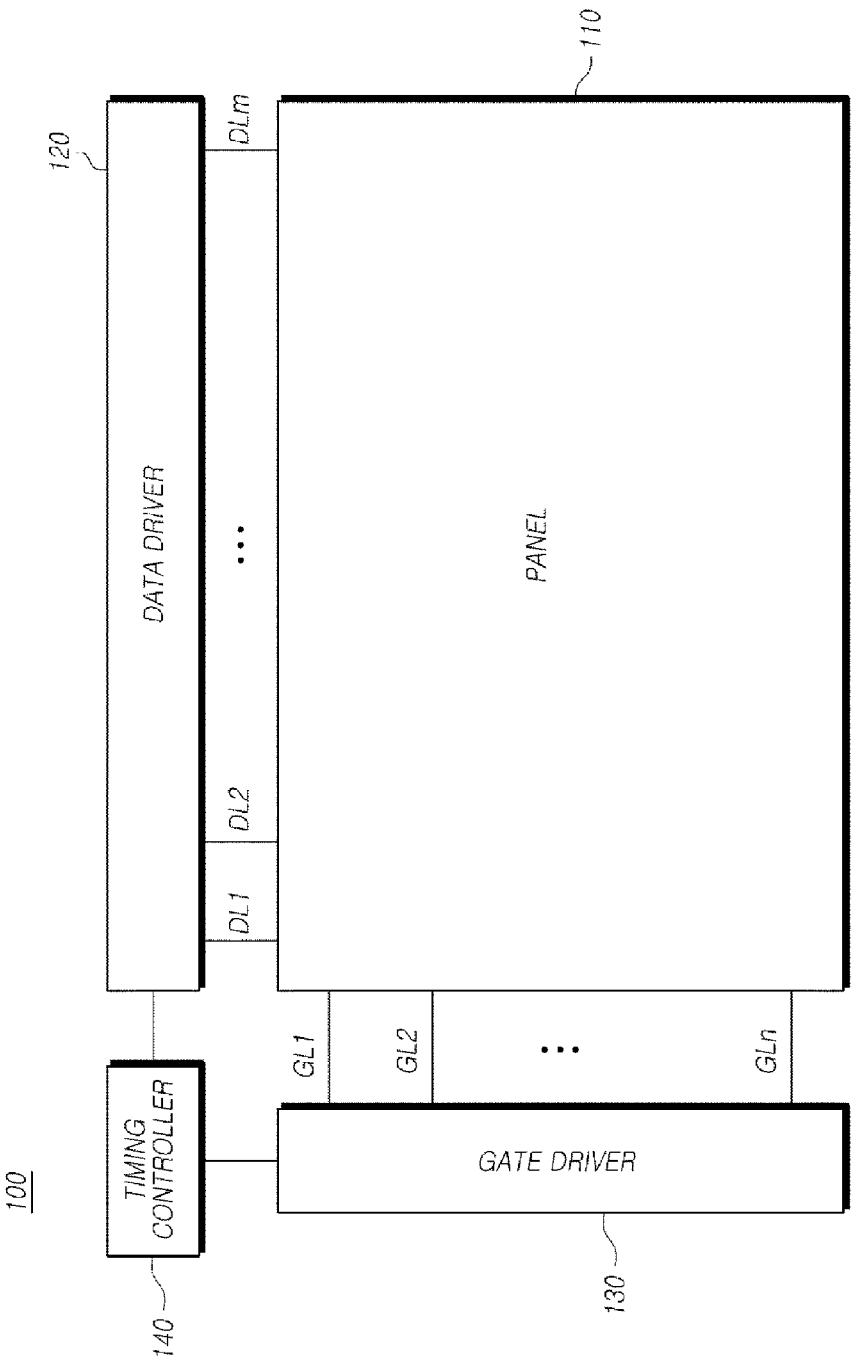
FIG. 1 is a schematic diagram illustrating the system configuration of a display device according to an exemplary embodiment of the present invention.

Reference will now be made in detail to the present invention, embodiments of which are illustrated in the accompanying drawings. Throughout this document, reference should be made to the drawings, in which the same reference numerals and signs may be used throughout the different drawings to designate the same or similar components. In the following description of the present invention, detailed descriptions of known functions and components incorporated herein will be omitted in the case that the subject matter of the present invention may be rendered unclear thereby.

It will also be understood that, although terms such as "first," "second," "A," "B," "(a)" and "(b)" may be used herein to describe various elements, such terms are only used to distinguish one element from another element. The substance, sequence, order or number of these elements are not limed by these terms. It will be understood that when an element is referred to as being "connected to" or "coupled to" another element, not only can it be "directly connected" or "coupled to" the other element, but also can it be "indirectly connected or coupled to" the other element via an "intervening" element. In the same context, it will be understood that when an element is referred to as being formed "on" or "under" another element, not only can it be directly formed on or under another element, but also can it be indirectly formed on or under another element via an intervening element.

FIG. 1 is a schematic diagram illustrating the system configuration of a display device according to an exemplary embodiment of the invention.

Referring to FIG. 1, the display device 100 according to an exemplary embodiment includes a display panel 110, a data driver 120, a gate driver 130 and a timing controller 140.

Data lines DL1, DL2, ... and DLm as well as gate lines GL1, GL2, ... and GLn are formed on the display panel 110, and subpixels (SPs) are formed at points where the data lines DL1, DL2, ... and DLm intersect the gate lines GL1, GL2 ... and GLn.

The data driver 120 supplies data voltages to the data lines.

Figure 2:
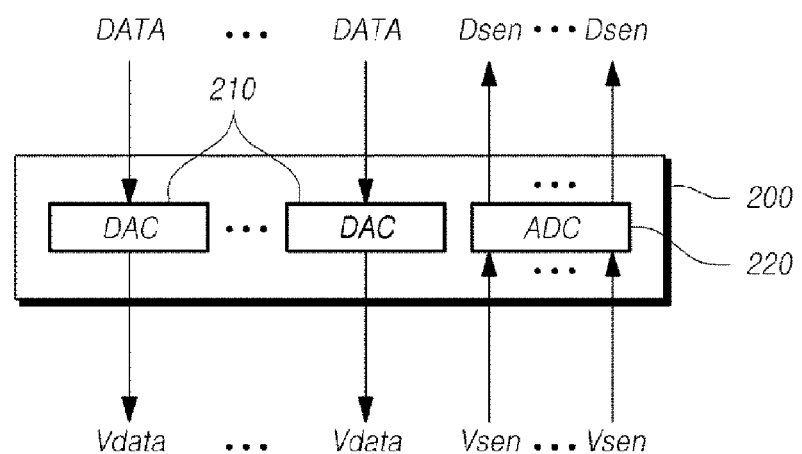
FIG. 2 is a diagram illustrating one of the DICs of the data driver in the display device according to an exemplary embodiment of the present invention.

The data driver 120 includes two or more data driver integrated circuits (DICs) (200, see FIG. 2).

The gate driver 130 sequentially supplies scanning signals to the gate lines.

The timing controller 140 controls the data driver 120 and the gate driver 130.

In addition, each of the subpixels formed on the display panel 110 is provided with a circuit including at least one transistor.

In addition to the at least one transistor, the circuit within each of the subpixels can further include other devices, such as at least one capacitor and at least one organic light-emitting diode (OLED), depending on the design of the circuit or the type of the display device.

The display device 100 according to an exemplary embodiment can provide a "pixel compensation function" for compensating for the difference in the luminance between the subpixels that is caused by a change or difference in the characteristics (e.g. a threshold voltage or mobility) between the transistors within the subpixels.

In addition, when a sensing result for pixel compensation is inaccurate even if the pixel compensation function is provided, the display device 100 according to an exemplary embodiment provides a "sensing unit compensation function" for compensating for the sensing result in order to achieve accurate pixel compensation.

Hereinafter, the pixel compensation function will be described first, and then the necessity of the sensing unit compensation function and its operation will be described in detail with reference to the drawings.

First, a description will be given to the pixel compensation function.

The display device 100 according to an exemplary embodiment requires a configuration for sensing the characteristics of the transistors of the circuits within the subpixels in order to provide the pixel compensation function.

Accordingly, the display panel 110 can be provided with "sensing lines (SL)" connected to circuits within the subpixels. A single sensing lines is provided on one or more rows of the subpixels.

The sensing lines can be disposed parallel to the data lines.

In addition, a single sensing line can be provided on one subpixel row or two or more subpixel rows.

For example, when a shared structure, in which a single sensing line is provided on two or more subpixel rows, is applied, the single sensing line may be provided on three subpixel rows (a red subpixel row, a green subpixel row and a blue subpixel row).

When a single pixel consists of three subpixels (a red subpixel (R), a green subpixel (G) and a blue subpixel (B)), one sensing line can be regarded as being provided on every pixel row.

In another example, a single sensing line can be provided on four subpixel rows (a red subpixel row, a white subpixel row, a green subpixel row and a blue subpixel row). That is, when a single pixel consists of four subpixels (a red subpixel row (R), a white subpixel row (W), a green subpixel row (G) and a blue subpixel row (B)), one sensing line can be regarded as being provided on every pixel row.

In addition, the display device 100 according to an exemplary embodiment can further include "sensing units" and a "pixel compensation unit" in addition to the "sensing lines" in order to provide the pixel compensation function. The sensing units convert sensed voltages Vsen measured through the sensing lines SL into digital sensed data Dsen. The pixel compensation unit converts data to be supplied to the subpixels for the pixel compensation, based on the sensed data sensed by and output from the sensing unit.

Hereinafter, the above-mentioned sensing units will also be referred to as analog digital converters, or shortly, as "ADCs".

Although the ADCs can be disposed in any position within the display device 100, the ADCs will be described and illustrated as being disposed within the data driver integrated circuits (DICs), respectively, by way of example throughout the specification and the drawings.

In addition, although the above-mentioned pixel compensation unit can be disposed at any position within the display device 100, the pixel compensation unit will be described and illustrated as being disposed within the timing controller 140, by way of example throughout the specification and the drawings.

FIG. 2 is a schematic diagram illustrating one of the DICs 200 of the data driver 120 in the display device 100 according to an exemplary embodiment.

Referring to FIG. 2, each of the DICs 200 includes a driving section supplying data voltages Vdata to a plurality of subpixels and a sensing section for the plurality of subpixels which the DIC 200 controls.

Referring to FIG. 2, the driving section includes a digital analog converter (hereinafter referred to as a "DAC") 210 which converts data input from the timing controller 140 into analog data Vdata.

Referring to FIG. 2, the sensing section can include an ADC 220. The ADC 220 senses voltages Vsen in sensing nodes of circuits within the plurality of subpixels, which it controls, through two or more sensing lines, converts the sensed voltages Vsen into digital sensed data Dsen, and then outputs the digital sensed data Dsen. Here, the sensing lines can be conceptually identical to sensing channels.

As illustrated in FIG. 2, one DIC 200 includes one ADC 220. Therefore, when the display device 100 has two or more DICs 200, two or more ADCs 220 are provided in the display device 100.

One ADC 220 of one DIC 200 is connected to two or more sensing lines SL and senses voltages Vsen through the sensing lines.

Here, one sensing line SL connects the ADC 220 to one or more subpixels. Specifically, each sensing line of two or more sensing lines connected to one ADC 220 can be a line which senses a voltage in a sensing node of a circuit within one subpixel, or a line which simultaneously or sequentially senses voltages in sensing nodes of circuits within two or more subpixels in a shared structure.

The ADC 220 of one DIC 200 outputs digital sensed data Dsen converted from the sensed voltages Vsen that are measured through the sensing channels corresponding to the two or more sensing lines.

Figure 3:
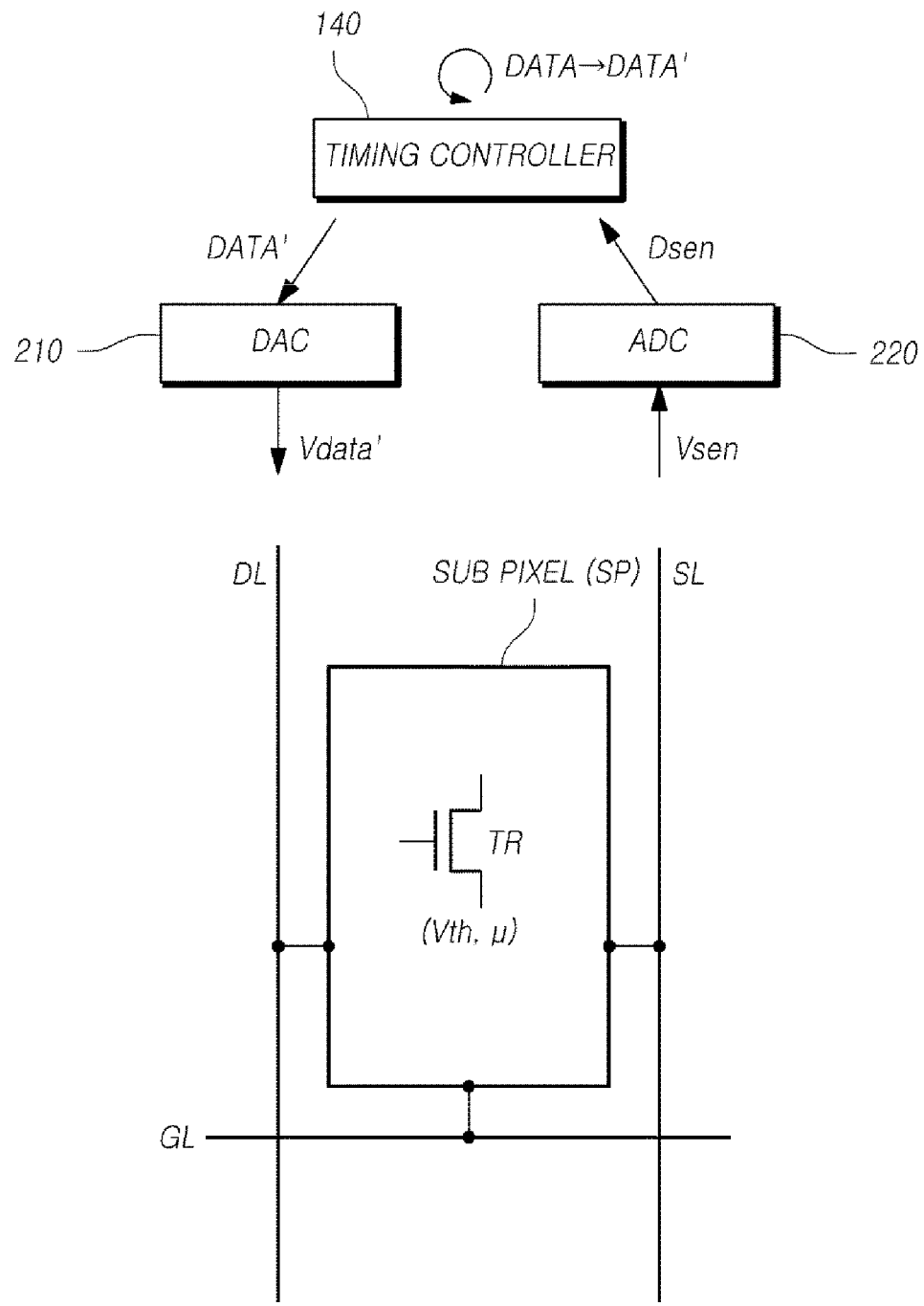
FIG. 3 and FIG. 4 are conceptual diagrams illustrating pixel compensation in the display device according to an exemplary embodiment.

FIG. 3 is a conceptual diagram illustrating pixel compensation in the display device 100 according to an exemplary embodiment.

Referring to FIG. 3, the ADC 220 within the DIC 200 senses a voltage Vsen in a sensing node (e.g. a source or drain node of a transistor) on a circuit within a subpixel SP through a sensing line SL connected to the circuit within the subpixel SP, converts the sensed voltage into digital sensed data, and then outputs the digital sensed data.

The timing controller 140 changes data Data to be supplied to the subpixel SP into changed data Data" using the sensed data Dsen and subsequently outputs the changed data Data' in order to compensate for the characteristics (e.g. a threshold voltage Vth or mobility μ) of a transistor TR within the subpixel SP.

Consequently, the DAC 210 within the DIC 200 converts the changed data Data'' into a data voltage Vdata' and subsequently outputs the data voltage Vdata'.

Accordingly, the data voltage Vdata' with which the characteristics of the transistor TR can be compensated is supplied to the subpixel SP through the data line DL, whereby the non-uniformity of the luminance of the subpixel SP can be prevented or reduced.

The pixel compensation that has been described in brief with reference to FIG. 3 will be described in greater detail with reference to FIG. 4 and FIG. 5.

Figure 4:
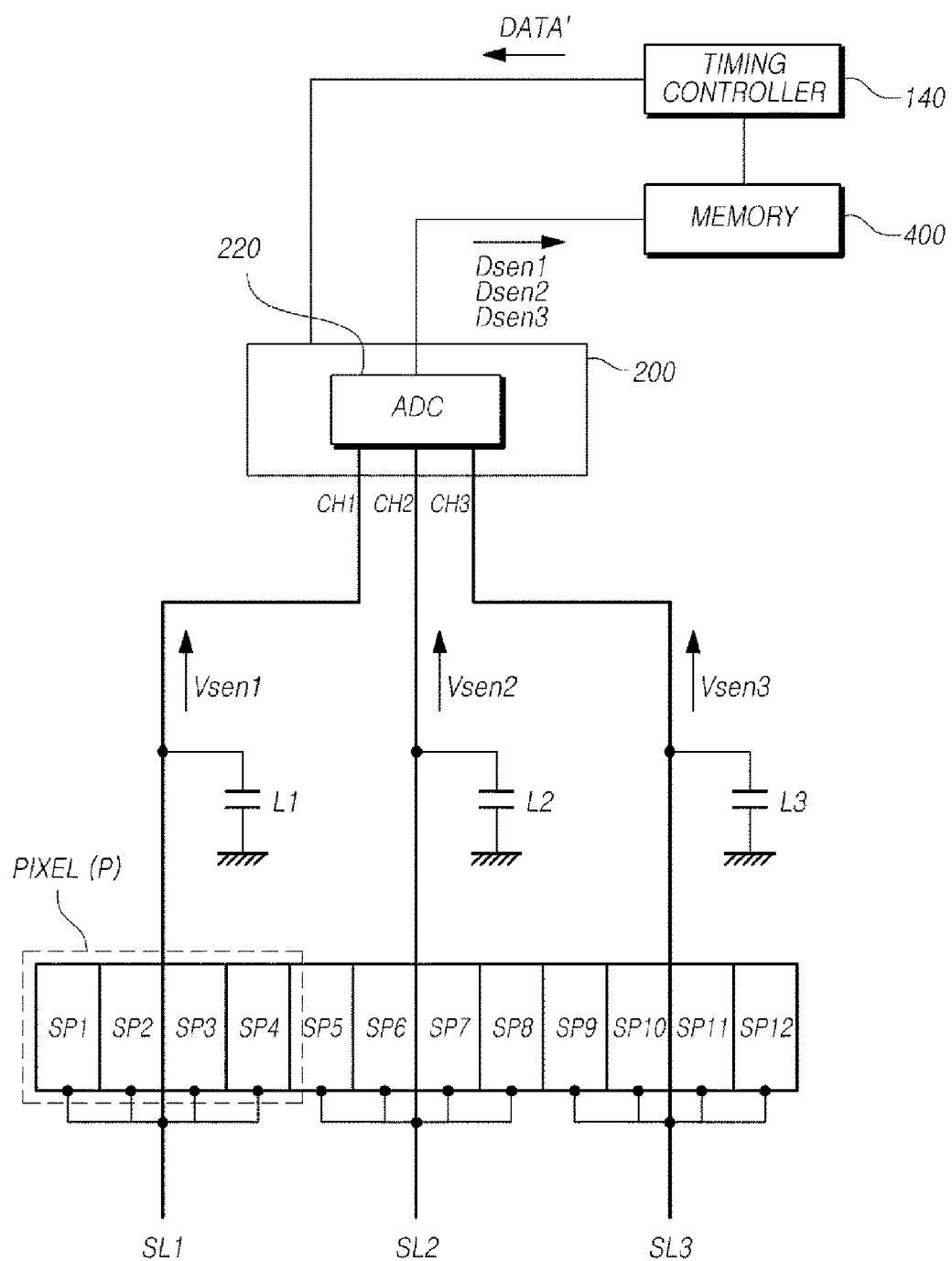
Figure 5:
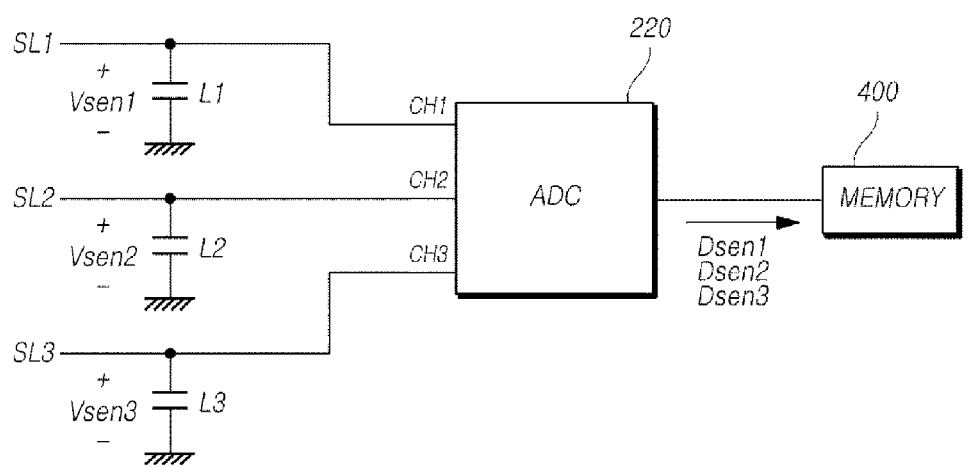
FIG. 5 is a conceptual diagram illustrating sensing and conversion functions of the ADC in the display device according to an exemplary embodiment.

FIG. 4 is a diagram illustrating the pixel compensation in the display device 100 according to an exemplary embodiment, and FIG. 5 is a conceptual diagram illustrating sensing and conversion functions of the ADC 220 in the display device 100 according to an exemplary embodiment.

As illustrated in FIG. 4, one ADC 220 has three sensing channels CH1, CH2 and CH3.

The three sensing channels CH1, CH2 and CH3 are connected to three sensing lines SL1, SL2 and SL3 in one-to-one correspondence.

Each of the three sensing channels CH1, CH2 and CH3 is connected to four subpixels SP.

Specifically, the sensing channel CH1 and the corresponding sensing line SL1 are connected to and shared by the subpixels SP1, SP2, SP3 and SP4. The sensing channel CH2 and the corresponding sensing line SL2 are connected to and shared by the subpixels SP5, SP6, SP7 and SP8. The sensing channel CH3 and the corresponding sensing line SL3 are connected to and shared by the subpixels SP9, SP10, SP11 and SP12.

Four subpixels SP constitute a single pixel P.

In an example, the four subpixels SP may include a red subpixel (R), a white subpixel (W), a green subpixel (G) and a blue subpixel (B). For example, the subpixels SP1, SP5 and SP9 may be the red subpixels (R), the subpixels SP2, SP6 and SP10 may be the white subpixels (W), the subpixels SP3, SP7 and SP11 may be green subpixels (G), and the subpixels SP4, SP8 and SP12 may be the blue subpixels (B).

Referring to FIG. 4, the ADC 220 can sense a voltage Vsen in a sensing node in each subpixel SP through the three sensing lines SL1, SL2 and SL3 at one point of time.

For example, at a first point of time, the ADC 220 can sense a voltage Vsen1 in a sensing node of a circuit within one subpixel, for example, the subpixel SP1, from among the four subpixels SP1, SP2, SP3 and SP4 connected to the sensing line SL1, through the sensing line SL1.

In addition, the ADC 220 can sense a voltage Vsen2 in a sensing node of a circuit within one subpixel, for example, the subpixel SP5, from among the four subpixels SP5, SP6, SP7 and SP8 connected to the sensing line SL2, through the sensing line SL2.

Furthermore, the ADC 220 can sense a voltage Vsen3 in a sensing node of a circuit within one subpixel, for example, the subpixel SP9, from among the four subpixels SP9, SP10, SP11 and SP12 connected to the sensing line SL3, through the sensing line SL3.

After the first point of time, at a second point of time, the ADC 220 can sense a voltage Vsen1 in a sensing node of a circuit within another subpixel, for example, the subpixel SP2, from among the four subpixels SP1, SP2, SP3 and SP4 connected to the sensing line SL1, through the sensing line SL1.

In addition, the ADC 220 can sense a voltage Vsen2 in a sensing node of a circuit within another subpixel, for example, the subpixel SP6, from among the four subpixels SP5, SP6, SP7 and SP8 connected to the sensing line SL2, through the sensing line SL2.

Furthermore, the ADC 220 can sense a voltage Vsen3 in a sensing node of a circuit within another subpixel, for example, the subpixel SP10, from among the four subpixels SP9, SP10, SP11 and SP12 connected to the sensing line SL3, through the sensing line SL3.

In other words, at the first point of time, the ADC 220 can simultaneously sense the voltages Vsen1, Vsen2 and Vsen3 in the sensing nodes within the circuits of the subpixels SP1, SP5 and SP9 corresponding to the red subpixels (R), through the sensing lines SL1, SL2 and SL3.

At the second point of time, the ADC 220 can simultaneously sense the voltages Vsen1, Vsen2 and Vsen3 in the sensing nodes within the circuits of the subpixels SP2, SP6 and SP10 corresponding to the white subpixels (W), through the sensing lines SL1, SL2 and SL3.

In addition, at a third point of time, the ADC 220 can simultaneously sense voltages Vsen1, Vsen2 and Vsen3 in sensing nodes within circuits of the subpixels SP3, SP7 and SP11 corresponding to the green subpixels (G), through the sensing lines SL1, SL2 and SL3.

Furthermore, at a fourth point of time, the ADC 220 can simultaneously sense voltages Vsen1, Vsen2 and Vsen3 in sensing nodes within circuits of the subpixels SP4, SP8 and SP12 corresponding to the blue subpixels (B), through the sensing lines SL1, SL2 and SL3.

Referring to FIG. 4 and FIG. 5, latches L1, L2 and L3 are connected to the three sensing lines SL1, SL2 and SL3, respectively. The voltages Vsen sensed in the sensing nodes within the corresponding subpixels are stored in the latches L1, L2 and L3.

Specifically, the voltage Vsen1 sensed in the sensing node within a subpixel to be sensed from among the four subpixels SP1, SP2, SP3 and SP4 connected to the sensing line SL1 is stored in the latch L1 connected to the sensing line SL1. The sensed voltage Vsen2 sensed in the sensing node within the subpixel from among the four subpixels SP5, SP6, SP7 and SP8 connected to the sensing line SL2 is stored in the latch L2 connected to the sensing line SL2. The voltage Vsen3 sensed in the sensing node within the subpixel to be sensed from among the four subpixels SP9, SP10 SP11 and SP12 connected to the sensing line SL3 is stored in the latch L3 connected to the sensing line SL3.

Each of the above-mentioned latches L1, L2 and L3 can be implemented as a capacitor, as illustrated in FIG. 4.

Referring to FIG. 4 and FIG. 5, the ADC 220 can simultaneously measure the sensed voltages Vsen1, Vsen2 and Vsen3 through the three sensing channels CH1, CH2 and CH3 by reading the voltages Vsen1, Vsen2 and Vsen3 stored in the three latches L1, L2 and L3.

Referring to FIG. 4 and FIG. 5, the ADC 220 converts the voltages Vsen1, Vsen2 and Vsen3 sensed through the sensing channels CH1, CH2 and CH3 into digital sensed data, outputs the converted sensed data Dsen1, Dsen2 and Dsen3, and then stores the data Dsen1, Dsen2 and Dsen3 in memory 400.

Referring to FIG. 4, the timing controller 140 changes data Data to be supplied to the subpixels into data Data' by reading in all portions of the sensed data Dsen1, Dsen2 and Dsen3, which have been sensed by the ADC 220 and stored in the memory 400 as described above, and then outputs the changed data Data' to the DIC 200.

Then, the DIC 200 receives the changed data Data', converts the changed data Data' into analog data voltages Vdata', and then supplies the analog data voltages Vdata' to the corresponding subpixels via an output buffer (not shown).

Figure 6:
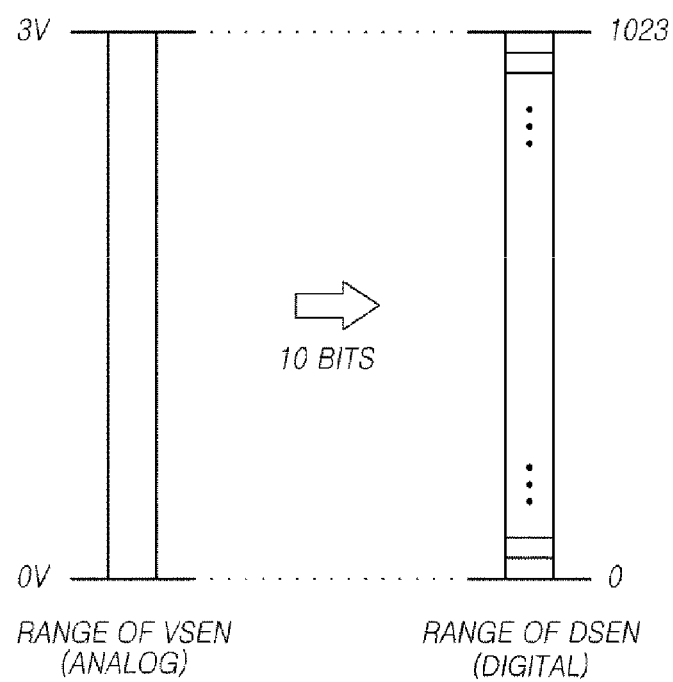
FIG. 6 is a diagram illustrating the range of an input voltage and the range of output data of the ADC in the display device 100 according to an exemplary embodiment.

FIG. 6 is a diagram illustrating the range of an input voltage Vsen and the range of output data of the ADC 220 in the display device 100 according to an exemplary embodiment.

Referring to FIG. 6, for example, the input voltage of the ADC 220 can range from 0 to 3 V, and the output data of the ADC 220 can range from 0 to 1023 corresponding to 10 bits.

That is, the ADC 220 converts the voltage Vsen within the input voltage range from 0 to 3 V into the digital data Dsen within the output data range from 0 to 10123 that can be expressed in 10 bits.

Figure 7:
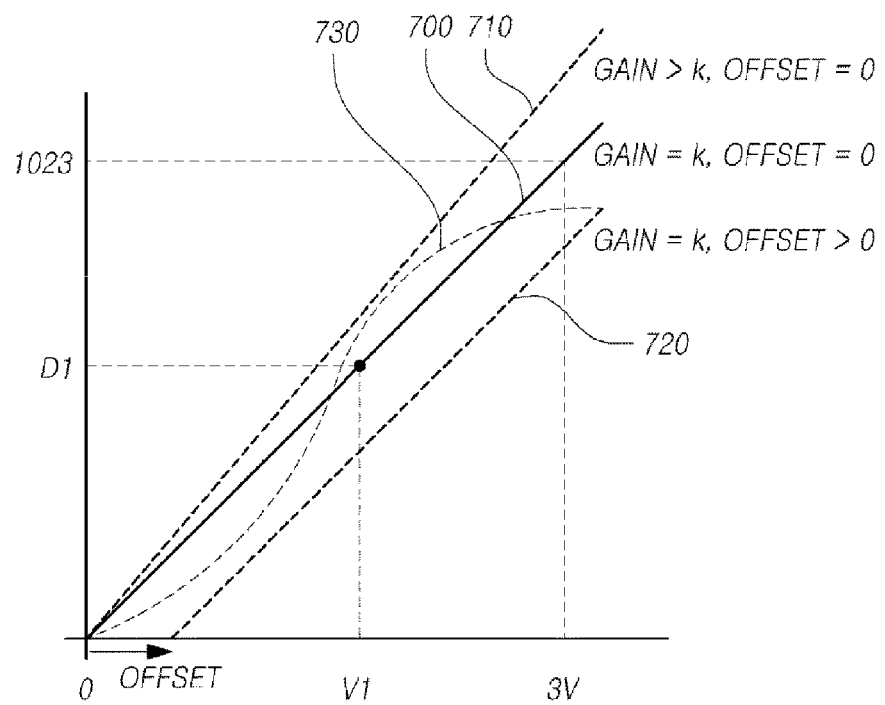
FIG. 7 is a graph illustrating the input-output relationship and the characteristic information of the ADC in the display device 100 according to an exemplary embodiment.

The input-output relationship of the ADC 220 can be expressed on a graph (x axis: input voltage, y axis: output voltage), as illustrated in FIG. 7.

FIG. 7 is a graph illustrating the input-output relationship and the characteristic information of the ADC 220 in the display device 100 according to an exemplary embodiment.

Referring to FIG. 7, the input-output relationship of the ADC 220 can be ideally defined along a straight line 700 that connects between a point (0, 0) where an input voltage is 0 V and output data is 0 and a point (3, 1023) where an input voltage is 3 V and output data is 1023.

This ideal ADC 220 can have an ideal linear ADC characteristic where a gain corresponding to the incline is k (=1023/3V) and an offset corresponding to an x-intercept is 0.

In addition, although the ADC 220 has the linear ADC characteristic, the linear ADC characteristic of the ADC 220 can differ from the ideal linear characteristic of the straight line 700. In practice, the linear ADC characteristic of the ADC 220 can be expressed by a straight line 710 where a gain corresponding to an incline is greater than k.

In practice, the linear ADC characteristic of the ADC 220 can be expressed by a straight line where a gain corresponding to an incline is smaller than k.

In addition, in practice, the ADC 220 can have linear ADC characteristic expressed by a straight line 720 where an offset corresponding to an x-intercept is greater than 0 instead of the straight line 700 that exhibits the ideal linear characteristics.

In practice, the linear ADC characteristic of the ADC 220 can be expressed by a straight line (not shown) where an offset corresponding to an x-intercept is smaller than 0.

In practice, the ADC 220 can have non-linear ADC characteristic expressed by a curved line 730 illustrated in FIG. 7 instead of having the linear ADC characteristic corresponding to the tendencies of the input-output relationships defined by the above-mentioned straight lines 700, 710 and 720.

As described above, regarding the ADC characteristic of the ADC 220, the phenomenon where a gain differs from an ideal gain (=k), an offset differs from an ideal offset (=0), or the line is non-linear can be an actual phenomenon that occurs without any external factor or a phenomenon that is caused by an external factor.

The ADC characteristic of the ADC 220 can be changed by an external factor, for example, where the ADC 220 or the DIC 200 or display device 100 including the ADC 220 operates for an extended time, the temperature of the ADC 220 or the DIC 200 or display device 100 including the ADC 220 rises, or the ADC 220 or the DIC 200 or display device 100 including the ADC 220 is subjected to a high pressure.

As described above, when there is a change in the ADC characteristic of the ADC 220, the ADC characteristic of each ADC 220 may differ according to the sensing channels or the ADC characteristic of one ADC 220 may differ from that of the other ADCs 220.

That is, the change in the ADC characteristic may include at least one of the difference in the characteristics between the ADCs 220 or the difference in the characteristics between sensing channels of each ADC 220.

This change in the ADC characteristic will be described again with reference to FIG. 8 and FIG. 9.

Figure 8:
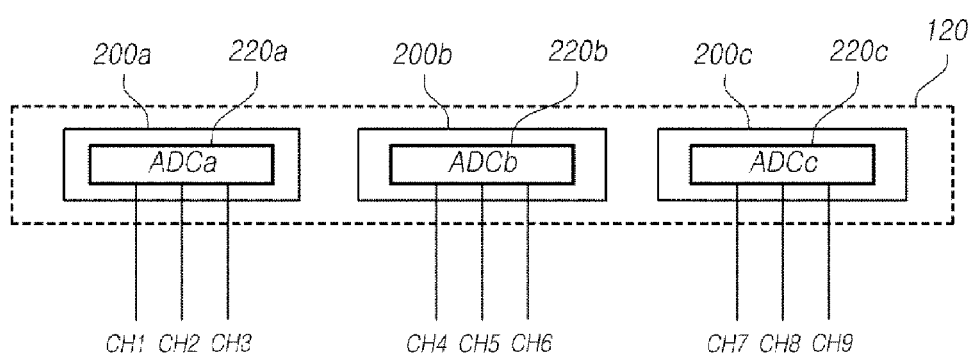
FIG. 8 is a diagram illustrating the data driver including three DICs in the display device according to an exemplary embodiment.
Figure 9:
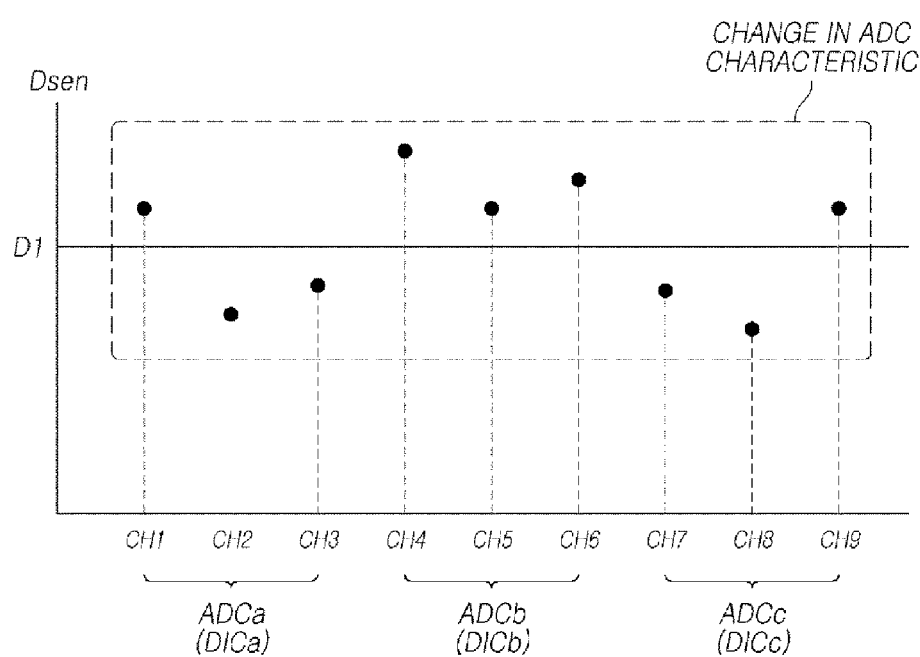
FIG. 9 is a diagram illustrating changes in ADC characteristic in the display device according to an exemplary embodiment.

FIG. 8 is a diagram illustrating the data driver 120 including three DICs 200a, 200b and 200c in the display device according to an exemplary embodiment. FIG. 9 is a diagram illustrating changes in the ADC characteristic in the display device according to an exemplary embodiment.

In order to study changes in the ADC characteristic, as illustrated in FIG. 8, the data driver 120 will be described by way of example as including the three DICs 200a, 200b and 200c.

Each of the three DICs 200a, 200b and 200c includes one ADC 220 (ADCa, ADCb, ADCc). Specifically, the first DIC 200a (DICa) includes the ADC 220a (ADCa), the second DIC 200b (DICb) includes the ADC 220b (ADCb), and the third DIC 200c (DICc) includes the ADC 220c (ADCc).

Referring to FIG. 8, in an example, the ADC 220a (ADCa) has three sensing channels CH1, CH2 and CH3 corresponding to three sensing lines, the ADC 220b (ADCb) has three sensing channels CH4, CH5 and CH6 corresponding to three sensing lines, and the ADC 220c (ADCc) has three sensing channels CH7, CH8 and CH9 corresponding to three sensing lines.

Referring to FIG. 9, the same voltage V1 is input to the three sensing channels CH1, CH2 and CH3 of the ADC 220a (ADCa), and in response to the same voltage V1, output data Dsen are extracted from the three sensing channels CH1, CH2 and CH3.

Likewise, the same voltage V1 is input to the three sensing channels CH4, CH5 and CH6, and in response to the same voltage V1, output data Dsen are extracted from the three sensing channels CH4, CH5 and CH6.

In the same manner, the same voltage V1 is input to the three sensing channels CH7, CH8 and CH9, and in response to the same voltage V1, output data Dsen are extracted from the three sensing channels CH7, CH8 and CH9.

When the output data Dsen is extracted from the nine sensing channels CH1 to CH9 as above can be expressed as in FIG. 9, it is apparent that the output data Dsen from the nine sensing channels CH1 to CH9 are different from each other.

In other words, the sensing channels of each ADC 220 output different data, and the ADCs 220 also output different data.

In FIG. 9, the straight line having output data D1 indicates output data that have an ideal linear ADC characteristic when an input voltage is V1.

As described above, when there is a change in the ADC characteristic for any reason, there occurs a problem in that the voltage Vsen sensed for pixel compensation is not converted into accurate sensed data Dsen. Consequently, pixel compensation may not be properly performed, thereby failing to overcome the non-uniformity of the luminance between the subpixels.

Therefore, this embodiment provides a function of compensating for a change in ADC characteristic (hereinafter referred to as the "ADC compensation function") by which accurate sensed data can be obtained regardless of a change in the ADC characteristic.

A more detailed description will be given below of the ADC compensation function by which accurate sensed data can be obtained regardless of a change in the ADC characteristic.

Figure 10:
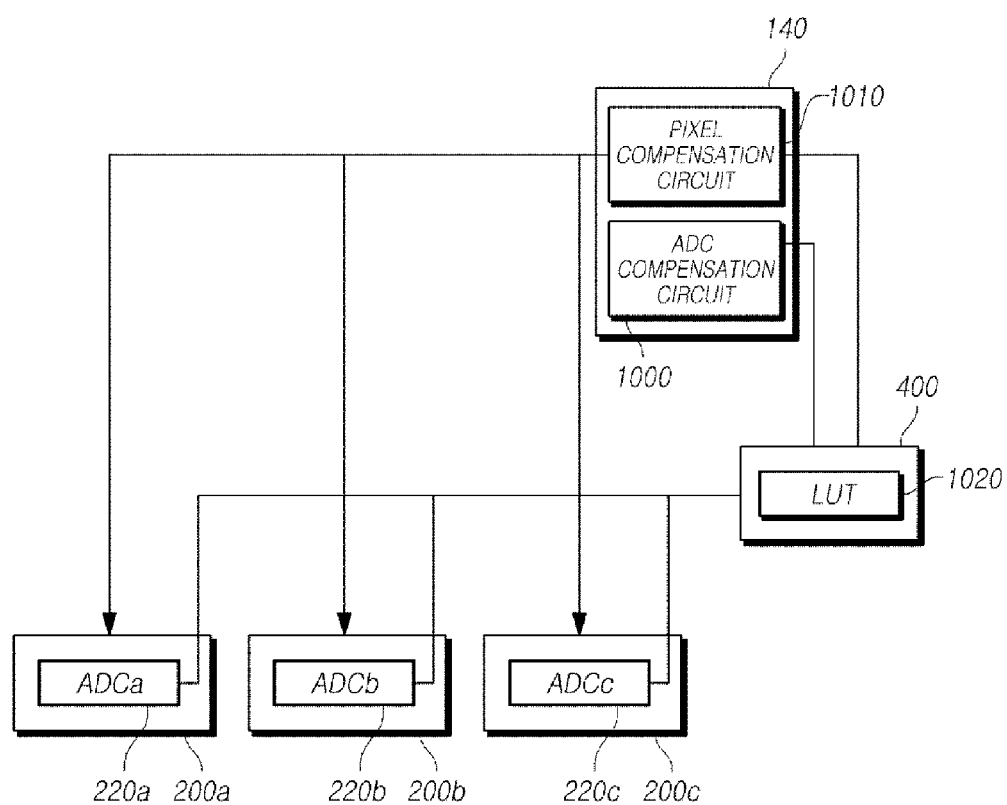
FIG. 10 is a schematic diagram illustrating a configuration for compensating for a change in ADC characteristic in the display device according to an exemplary embodiment.
Figure 11:
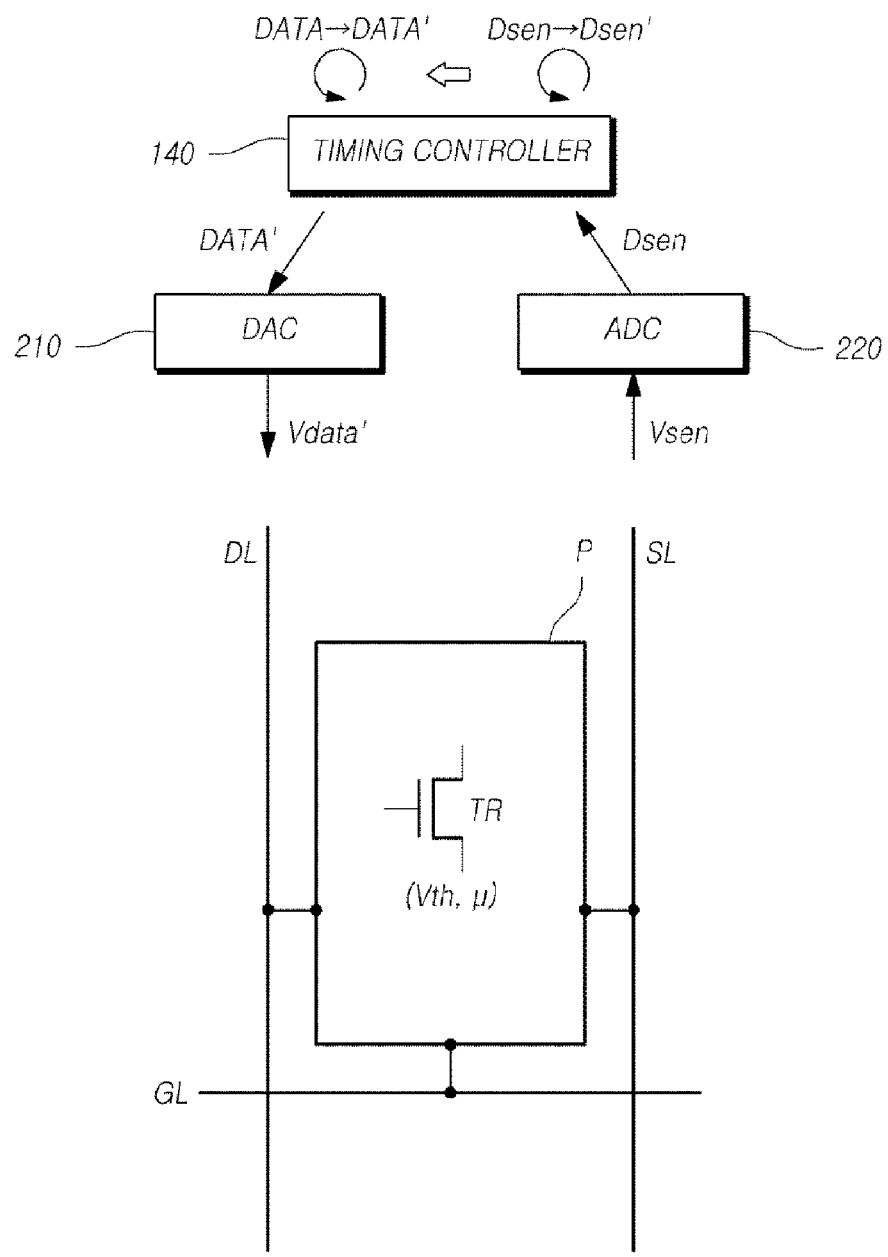
FIG. 11 is a conceptual diagram illustrating pixel compensation to which ADC compensation is applied in the display device according to an exemplary embodiment.

FIG. 10 is a schematic diagram illustrating a configuration for compensating for a change in the ADC characteristic in the display device 100 according to an exemplary embodiment, and FIG. 11 is a conceptual diagram illustrating pixel compensation to which ADC compensation is applied in the display device 100 according to an exemplary embodiment.

Referring to FIG. 10, the display device 100 according to an exemplary embodiment includes an ADC compensation circuit 1000 and a pixel compensation circuit 1010. The ADC compensation circuit 1000 and the pixel compensation circuit 1010 can be components of the timing controller 140.

Referring to FIG. 10, when there is a change in the ADC characteristic, the ADC compensation circuit 1000 performs ADC compensation by updating a lookup table (LUT) 1020 that includes ADC characteristic information according to the sensing channels such that the change in the ADC characteristic including at least one of the difference in the characteristics between the ADCs 220 and the difference in the characteristics between the sensing channels within each ADC 220 can be compensated.

Referring to FIG. 10 and FIG. 11, the pixel compensation circuit 1010 of the timing controller 140 performs the pixel compensation such that the characteristics (e.g. a threshold voltage Vth or mobility μ) of the transistor within each subpixel is compensated, based on the changed sensed data Dsen' of the sensed data Dsen according to the lookup table 1020 updated by the ADC compensation circuit 1000.

Accordingly, the timing controller 140 changes data Data to be supplied to the subpixels SP into data Data', based on the changed sensed data Dsen' according to the lookup table 1020 which is updated by the ADC compensation circuit 1000, and outputs the changed data Data'.

Then, the DAC 210 within the DIC 200 converts the changed data Data' into data voltages Vdata' and subsequently outputs the data voltages Vdata'.

The converted data voltages Vdata' are supplied to the corresponding subpixels SP.

Referring to FIG. 10 and FIG. 11, even if the sensed data Dsen output from the ADC 220 are inaccurate due to a change in the ADC characteristic, the sensed data Dsen are compensated, and the pixel compensation is performed using the changed sensed data Dsen' that has been compensated. It is therefore possible to remove the inaccuracy from the sensed data and the pixel compensation caused by the change in the ADC characteristic.

A more detailed description will be given below of the above-described ADC compensation circuit 1000.

The above-described ADC compensation circuit 1000 senses a change in the ADC characteristic (a change in the ADC characteristic information) if the sensed data Dsen obtained by the two or more ADCs 220 differ from the reference data previously stored in the memory. In this case, the ADC compensation circuit 1000 can enhance the accuracy with which the change in the ADC characteristic is sensed by further considering at least one of temperature change information and pressure change information received from the sensors (not shown).

After the change in the ADC characteristic is sensed, the ADC compensation circuit 1000 can perform ADC compensation to update the lookup table 1020 by changing at least one piece of information (e.g. an offset) from among the ADC characteristic information according to the sensing channels (e.g. offsets or gains) included in the lookup table 1020 in order to compensate for the change in the ADC characteristic.

This ADC compensation can be performed in response to a signal indicating that the display device 100 is powered-off or can be performed in real time while the display device 100 is being powered on.

Herein, the "ADC compensation" is referred to as compensation that is performed in real time through data driver IC sensing (hereinafter referred to as "RTDS") or is simply referred to as "RTDS".

Alternatively, the pixel compensation can be performed in real time to compensate for the mobility μ of the transistors within the subpixels.

Here, the pixel compensation intended to compensate for the mobility in real time while the display device 100 is being powered on is referred to as real-time compensation (hereinafter referred to as "RT compensation"). In addition, sensing for the "RT compensation" is referred to as "RT sensing".

For the above-described RT compensation, the timing controller 140 can control the pixel compensation (RT compensation) to compensate for the mobility of the transistor of each subpixel in a blank time on a vertical synchronous signal Vsync.

In addition, the timing controller 140 can control ADC compensation (i.e. RTDS) in response to a signal indicating that the display device 100 is powered-off, and afterwards, control pixel compensation to compensate for the threshold voltage of the transistor within each subpixel.

The pixel compensation of compensating for the threshold voltage of the transistor within each subpixel in response to the signal indicating that the display device 100 is powered-off is referred to as "off real-time sensing" (hereinafter referred to as "OFF RS").

Although the ADC compensation (i.e. the RTDS) can be performed in response to the signal indicating that the display device 100 is powered off as described above, the ADC compensation can be performed in real time while the display device 100 is being powered on.

As such, when the ADC compensation is performed in real time while the display device 100 is being powered on, it is required to control the timing for the RT compensation corresponding to the pixel compensation that is performed in real time while the display device 100 is being powered on and timing for the RTDS corresponding to the ADC compensation.

Therefore, the timing controller 140 can control the timing such that all of the pixel compensation (RT compensation) and the ADC compensation (RTDS) are performed before the generation of the signal indicating that the display device 100 is powered off, i.e. while the display device 100 is being turned on.

For example, the timing controller 140 can control the ADC compensation to be performed during at least one blank time from among several blank times on the vertical synchronous signal Vsync in one frame before the generation of the signal indicating that the display device 100 is powered off, and can control the pixel compensation to be performed in the remaining blank times.

As such, when the ADC compensation (RTDS) is already performed in real time while the display device 100 is being turned on, the timing controller 140 can control the pixel compensation to be performed such that the threshold voltage of the transistor within each subpixel (OFF RS) is compensated without performing the ADC compensation (i.e. RTDS) when the power-off signal is generated.

In addition, the above-mentioned lookup table 1020 can include offsets and gains according to the sensing channels for each of two or more ADCs 220, the offsets and gains being included in the ADC characteristic information defining the input-output relationship.

When the lookup table 1020 is updated by the ADC compensation circuit 1000, at least one (e.g. an offset) of the offsets and gains of the ADC characteristic information can be changed.

The voltage Vsen sensed at the ADC 220 during the sensing of a threshold voltage is higher than the voltage Vsen sensed at the ADC 220 during the sensing of mobility. The input voltage Vsen of the ADC 220 during the threshold voltage sensing is higher than the input voltage Vsen of the ADC 220 during the mobility sensing. Therefore, the lookup table 1020 that is to be referred to for the threshold voltage sensing must differ from the lookup table 1020 that is to be referred to for the mobility sensing.

Accordingly, the lookup table 1020 stored in the memory 400 can include a first lookup table for threshold voltage sensing mode and a second lookup table for mobility sensing mode, the second lookup table being separate from the first lookup table.

As described above, the change in the ADC characteristic can be a change in the characteristics between the ADCs 220 or between the sensing channels within each ADC 220.

Herein, two compensation methods are disclosed as the ADC compensation by which a change in the ADC characteristic is compensated. One method compensates for a change in the ADC characteristic according to the DICs (hereinafter referred to as "DIC-specific ADC compensation" or "first ADC compensation"). The other method compensates for a change in the ADC characteristic according to the sensing channels (hereinafter referred to as "CH-specific compensation" or "second compensation").

A detailed description will be given below of the two ADC methods with reference to FIG. 12 to FIG. 23.

Figure 12A:
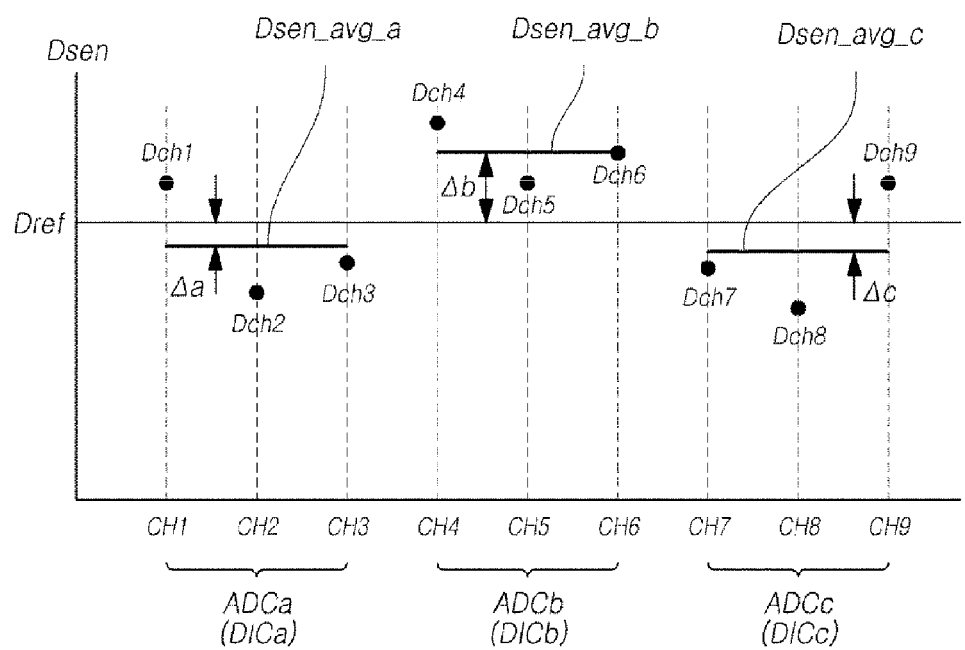
FIG. 12A and FIG. 12B are diagrams illustrating two ADC compensation methods in the display device according to an exemplary embodiment.
Figure 12B:
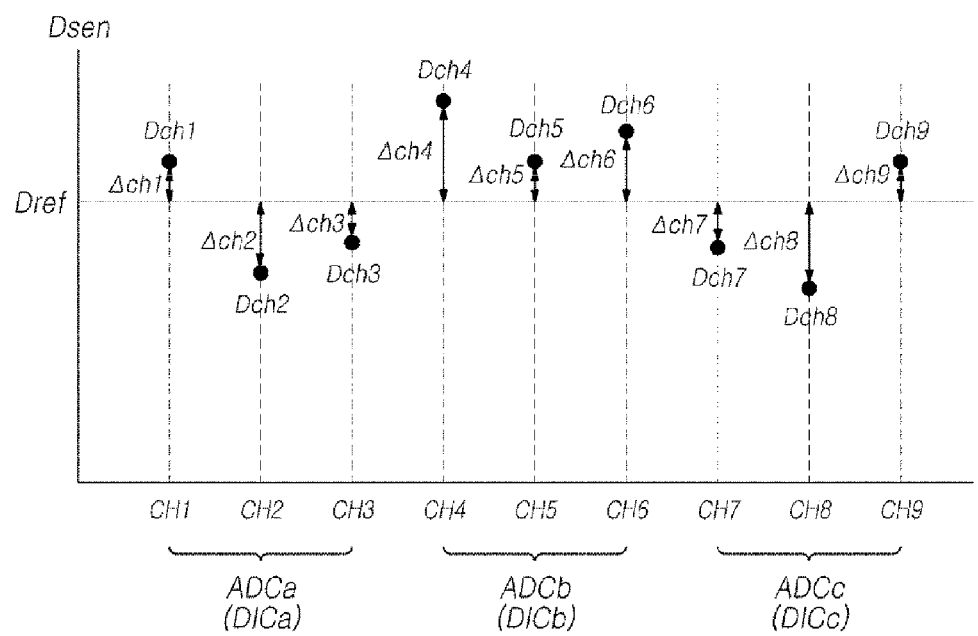

FIG. 12A and FIG. 12B are diagrams illustrating the two ADC compensation methods in the display device 100 according to an exemplary embodiment.

FIG. 12A is a diagram conceptually illustrating the first ADC compensation of compensating for a change in the ADC characteristic according to the DICs 200.

Referring to FIG. 12A, even if the sensed data differ according to the sensing channels of one DIC, the sensed data Dsen are changed by the same amount of compensation for all of the sensing channels of one DIC 200, based on the difference Δ between one average sensed data Dsen_avg obtained by averaging the sensed data according to the sensing channels and preset reference data Dref.

With reference to FIG. 12A, a description will be given of the ADC compensation in the first data DIC 200a (DICa), i.e. in the ADC 220a (ADCa). In the ADC 220a (ADCa) which is a component of the first DIC 200a (DICa), when the same voltage is input to three sensing channels CH1, CH2 and CH3, the ADC 220a (ADCa) outputs three sets of different sensed data Dch1, Dch2 and Dch3, and stores the three sets of different sensed data Dch1, Dch2 and Dch3 in the memory 400.

The ADC compensation circuit 1000 obtains average sensed data Dsen_avg_a by averaging the three sets of different sensed data Dch1, Dch2 and Dch3, and calculates the difference between the average sensed data Dsen_avg_a and the reference data Dref previously stored in the memory 400.

The ADC compensation circuit 1000 updates the lookup table 1020 by adding or deducting the same amount of compensation Δa to or from the ADC characteristic information of each of the three sensing channels CH1, CH2 and CH3 of the ADC 220a (ADCa) stored in the lookup table 1020.

It is appreciated that the three sets of sensed data Dch1, Dch2 and Dch3 for the three sensing channels CH1, CH2 and CH3 of the ADC 220a (ADCa) are compensated by the same amount of compensation Δa even if the three sets of sensed data Dch1, Dch2 and Dch3 are different from each other. This fails to reflect the difference in the characteristics between the sensing channels, which is problematic. This problem will be described in greater detail with reference to FIG. 16 and FIG. 17.

Referring to FIG. 12A, in the ADC 220b (ADCb) which is a component of the second DIC 200b (DICb), three sets of sensed data Dch4, Dch5 and Dch6 for the three sensing channels CH4, CH5 and CH6 of the ADC 220b (ADCb) are compensated by the same amount of compensation Δa even if the three sets of sensed data Dch4, Dch5 and Dch6 are different from each other, as in the ADC compensation in the ADC 220a (ADCa) which is a component of the first DIC 200a (DICa).

In addition, in the ADC 220c (ADCc) which is a component of the third DIC 200c (DICc), three sets of sensed data Dch7, Dch8 and Dch9 for the three sensing channels CH7, CH8 and CH9 are also compensated by the same amount of compensation Δa even if the three sets of sensed data Dch7, Dch8 and Dch9 are different from each other.

In FIG. 12A, it is assumed that all reference data Dref shall be the same for all sensing channels CH1 to CH9.

As described above, there is a drawback in that the first ADC compensation method fails to reflect the difference in the characteristics between the sensing channels. This drawback will be described in greater detail with reference to FIG. 16 and FIG. 17.

Regardless of this drawback, the first ADC compensation method has advantages in that the amount of data is reduced since it is required to store only one piece of reference data for each DIC and that the amount of calculation is reduced since the comparison of data for the update of the lookup table is performed according to the DICs. That is, the first ADC compensation method leads to efficient ADC compensation.

With reference to FIG. 12B, a description will be given below of the second ADC compensation method by which the ADC compensation is performed according to the sensing channels unlike in the first ADC compensation method.

Referring to FIG. 12B, the second ADC compensation method separately changes the sensed data Dsen by determining an amount of compensation for each of the sensing channels based on the difference between the sensed data Dsen and preset reference data Dref for the sensing channels, instead of averaging the sensed data according to the sensing channels.

With reference to FIG. 12B, a description will be given of the ADC compensation in the first DIC 200a (DICa), i.e. in the ADC 220a (ADCa). The ADC 220a (ADCa) which is a component of the first DIC 200a (DICa) receives the same voltage for three sensing channels CH1, CH2 and CH3, outputs three sets of different sensed data Dch1, Dch2 and Dch3, and stores the three sets of different sensed data Dch1, Dch2 and Dch3 in the memory 400.

The ADC compensation circuit 1000 calculates differences Δch1, Δch2 and Δch3 between the three sets of different sensed data Dch1, Dch2 and Dch3 and the reference data Dref previously stored in the memory 400.

The ADC compensation circuit 1000 updates the lookup table 1020 by adding or deducting corresponding amounts of compensation Δch1, Δch2 and Δch3 to or from the ADC characteristic information (e.g. offset) of the three sensing channels CH1, CH2 and CH3 of the ADC 220a (ADCa) stored in the lookup table 1020.

It is appreciated that the three sets of sensed data Dch1, Dch2 and Dch3 for the three sensing channels CH1, CH2 and CH3 are compensated by respective amounts of compensation Δch1, Δch2 and Δch3.

Accordingly, unlike the first ADC compensation method, the second ADC compensation method can more accurately compensate for the sensed data by reflecting the difference in the characteristics between the sensing channels, whereby the pixel compensation can be performed more precisely.

A more detailed description will be given below of the first ADC compensation method and several sensing procedures of the display device 100 using the first ADC compensation method with reference to FIG. 13 to FIG. 17, and then a more detailed description will be given below of the second ADC compensation method and several sensing procedures of the display device 100 using the second ADC compensation method with reference to FIG. 18 to FIG. 23.

Figure 13:
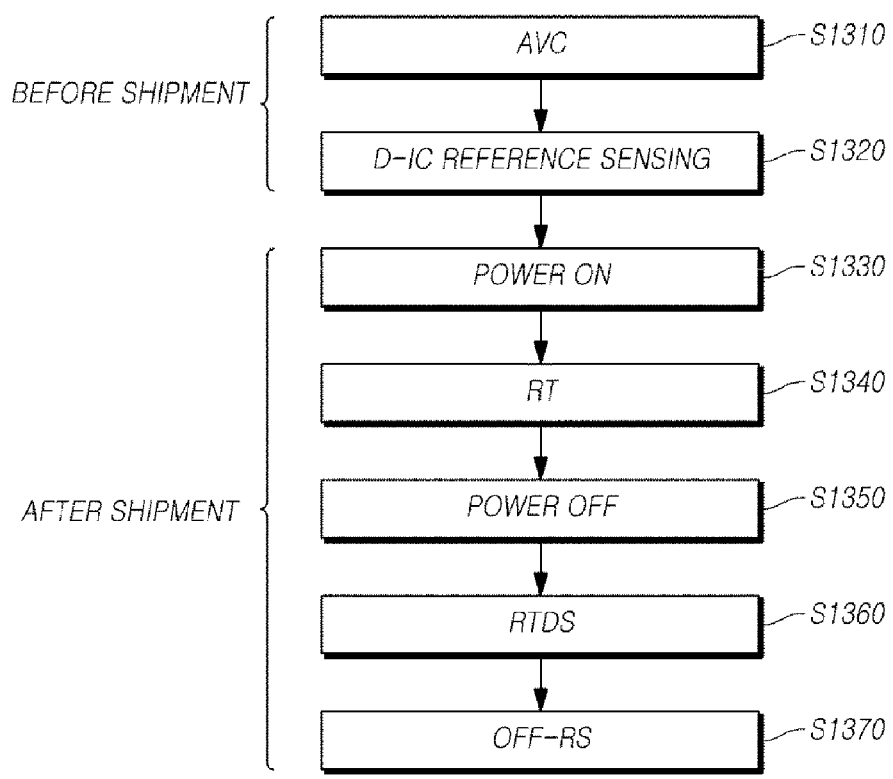
FIG. 13 is a flow diagram illustrating several sensing and compensation procedures using a first ADC compensation method in the display device according to an exemplary embodiment.
Figure 14:
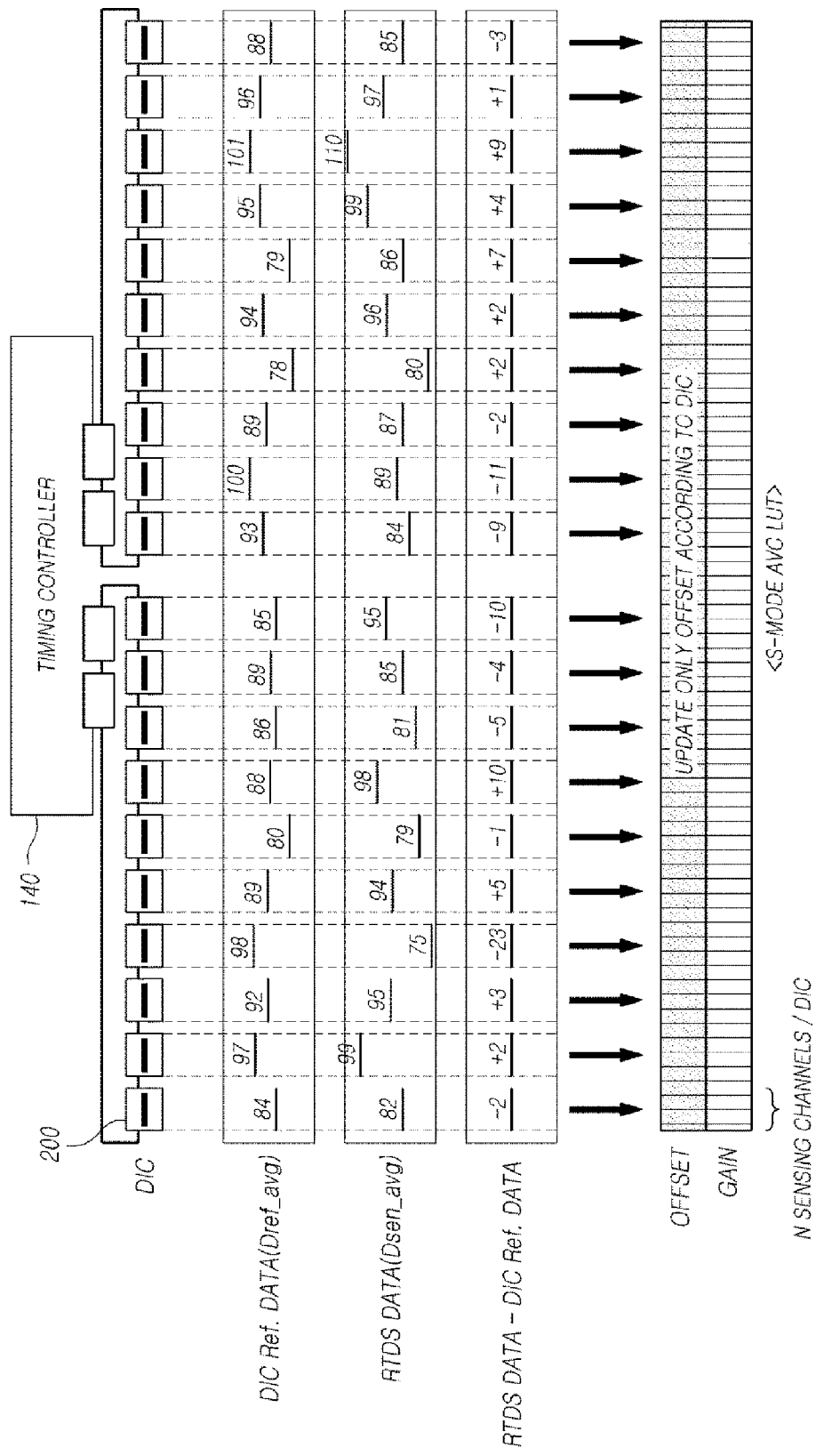
FIG. 14, FIG. 15A and FIG. 15B are diagrams illustrating the first ADC compensation method in the display device according to an exemplary embodiment.
Figure 15A:
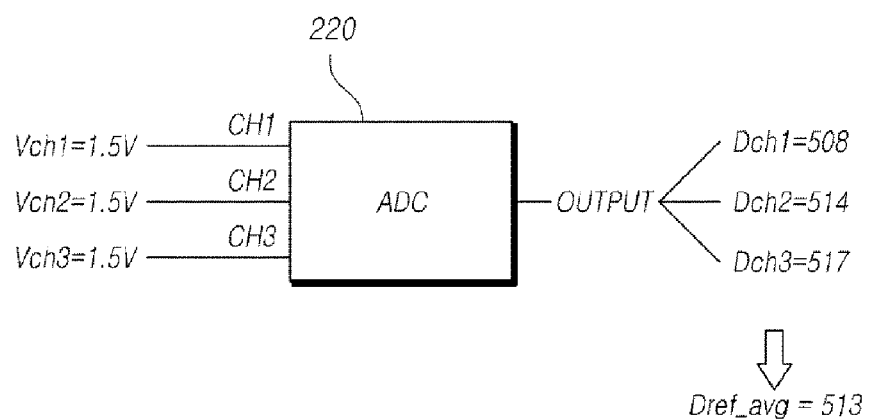
Figure 15B:
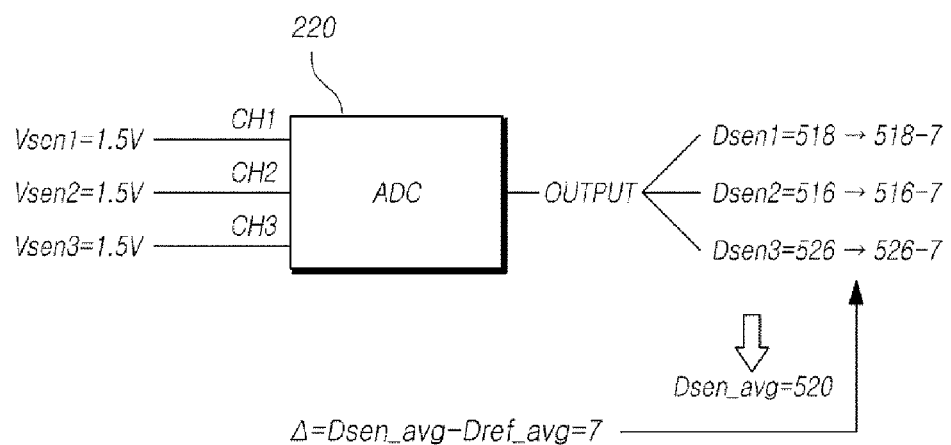

FIG. 13 is a flow diagram illustrating several sensing and compensation procedures using the first ADC compensation method in the display device 100 according to an exemplary embodiment, FIG. 14 is a diagram illustrating the first ADC compensation method when the display device 100 according to an exemplary embodiment includes 20 DICs 200, and FIG. 15A and FIG. 15B are diagrams illustrating the first ADC compensation method in the display device 100 according to an exemplary embodiment.

Referring to FIG. 13, during fabrication before the display device 100 is shipped, the ADC 220 is sensed using a computer or the like and the lookup table 1020 for the compensation of a change (difference) in the ADC characteristic is generated (S1310). This process is referred to as "ADC variation compensation (AVC)".

The generated lookup table 1020 includes a lookup table generated in the voltage range for threshold voltage sensing using a source meter (i.e. a lookup table for threshold voltage sensing mode) and a lookup table generated in the voltage range for mobility sensing (i.e. a lookup table for mobility sensing).

In addition, several sensed data are obtained by simultaneously sensing the ADCs 220 of all of the DICs several times, for example, at a specific voltage (intermediate voltage) within the voltage range for the threshold voltage sensing, and reference data according to the DICs 200 (also referred to as "DIC Ref. Data") are generated by averaging the several sensed data obtained in this manner (S1320).

Therefore, when the display device 100 is shipped, the lookup table 1020 including the ADC characteristic information (offset and gain) according to the sensing channels and the DIC Ref. Data (Dref_avg) are stored in the memory 400 which is in the initialization state.

After the shipment of the display device 100, the display device 100 is powered on (S1330). Then, while the display device 100 is being powered on, the pixel compensation circuit 1010 within the timing controller 140 can perform real-time pixel compensation (RT compensation) such that the mobility of the transistor within each subpixel is compensated in real time (S1340).

Afterwards, when a signal indicating that the display device 100 is powered off (S1350), ADC compensation (i.e. RTDS) is performed by the ADC compensation circuit 1000 (S1360).

After the ADC compensation step S1360, the pixel compensation circuit 1010 within the timing controller 140 performs pixel compensation (i.e. OFF RS) by referring to the updated lookup table 1020 such that the threshold voltage of the transistor within each subpixel is compensated (S1370).

The above-described step S1360 will be described in greater detail with reference to FIG. 14.

Referring to FIG. 14, the ADC compensation circuit 1000 acquires average sensed data according to the DICs (hereinafter referred to as "RTDS Data" or "Dsen_avg") by extracting a plurality of sensed data from the memory 400, the plurality of sensed data being obtained according to the ADCs 220 each of which is a component of a corresponding DIC of the two or more DICs 200, and averaging the plurality of sensed data.

Referring to FIG. 14, the ADC compensation circuit 1000 performs the ADC compensation (i.e. RTDS) by updating the lookup table 1020, based on the differences (Δ=RTDS Data−DIC Ref. Data) between the RTDS Data and the DIC Ref. Data (Dref_avg) at the same voltage.

Here, when the lookup table 1020 is updated, only the offsets according to the DICs (ADCs) are updated.

The updated lookup table 1020 is the lookup table for the threshold voltage sensing mode (S-mode) to be used at the step S1370 of performing the pixel compensation (OFF RS) such that the threshold voltage of the transistor within each subpixel is compensated.

The ADC compensation (RTDS) performed at the above-described step S1360 will be described by way of example with reference to FIG. 15A and FIG. 15B.

A description will be given of the generation of the DIC Ref. Data (Dref_avg) with reference to FIG. 15A.

Referring to FIG. 15A, the same voltage (e.g. 1.5 V) is input through the three sensing channels CH1, CH2 and CH3 of the ADC 220, and three sets of sensed data Dch1, Dch2 and Dch3 output from the ADC 220 are obtained through the sensing channels, respectively.

An average sensed data Dref_avg=513 is produced by averaging the three sets of sensed data Dch1, Dch2 and Dch3 that are obtained as above.

The average sensed data Dref_avg=513 obtained as above become DIC Ref. Data for the DIC 200 including the corresponding ADC 220, and are stored in the memory 400.

The above-described process is performed before the ADC compensation.

A description will be given of the ADC compensation (RTDS) with reference to FIG. 15B. The ADC compensation circuit 1000 obtains three sets of sensed data Dsen1, Dsen2 and Dsen3 output from the ADC 220 with respect to the three sensing channels through which the same voltage (e.g. 1.5 V) is input into the ADC 220.

Referring to FIG. 15B, the ADC compensation circuit 1000 obtains average sensed data Dsen_avg=520 by averaging the three sets of sensed data Dsen1, Dsen2 and Dsen3.

The average sensed data Dsen_avg=520 obtained as above become average sensed data (RTDS Data) for the DIC 200 including the corresponding ADC 220.

Referring to FIG. 15B, the ADC compensation circuit 1000 obtains the difference Δ=Dsen_avg−Dref_avg=7 between the RTDS Data (=Dsen_avg=520) and the DIC Ref. Data (=Dref_avg=513).

The ADC compensation circuit 1000 updates the lookup table 1020 by adding or deducting the obtained difference Δ=Dsen_avg−Dref_avg=7 to or from the ADC characteristic information (offset) according to the corresponding sensing channels of the lookup table 1020.

Consequently, during the OFF RS after the ADC compensation, provided the three sets of sensed data Dsen1, Dsen2 and Dsen3 output from the ADC 220 through the conversion of the sensed voltages Vsen through the three sensing channels CH1, CH2 and CH3 be 518, 516 and 526, the three sets of sensed data Dsen1, Dsen2 and Dsen3 are respectively changed to 511 (=518−7), 509 (=516−7) and 519 (=526−7).

Afterwards, when data are changed for the OFF RS (threshold voltage compensation), the changed sensed data Dsen1', Dsen2' and Dsen3' are used. Thus, the change in the ADC characteristic can be reflected when the data Data are changed to compensation data Data' with which the luminance of the corresponding subpixel is compensated.

Referring to FIG. 15A and FIG. 15B, the sensed data Dch1 obtained for the sensing channel CH1 in order to generate the DIC Ref. Data (Dref_avg) is 508, and the sensed data Dsen1 obtained for the sensing channel CH1 in order to produce the RTDS Data (Dsen_avg) is 518, in which the difference between the two sensed data Dch1 and Dsen1 is 10. In addition, the difference between the RTDS Data (=Dsen_avg=520) and the DIC Ref. Data (=Dref_avg=513) is 7. Accordingly, the difference between the two differences is 3.

In addition, referring to FIG. 15A and FIG. 15B, the sensed data Dch2 obtained for the sensing channel CH2 in order to generate the DIC Ref. Data (Dref_avg) is 514, and the sensed data Dsen2 obtained for the sensing channel CH2 in order to produce the RTDS Data (Dsen_avg) is 516, in which the difference between the two sensed data Dch2 and Dsen2 is 2. In addition, the difference between the RTDS Data (=Dsen_avg=520) and the DIC Ref. Data (=Dref_avg=513) is 7. Accordingly, the difference between the two differences is 5.

In addition, referring to FIG. 15A and FIG. 15B, the sensed data Dch3 obtained for the sensing channel CH3 in order to generate the DIC Ref. Data (Dref_avg) is 517, and the sensed data Dsen3 obtained for the sensing channel CH3 in order to produce the RTDS Data (Dsen_avg) is 526, in which the difference between the two sensed data Dch3 and Dsen3 is 9. In addition, the difference between the RTDS Data (=Dsen_avg=520) and the DIC Ref. Data (=Dref_avg=513) is 7. Accordingly, the difference between the two differences is 2.

Therefore, it is appreciated that the difference (5) between the average value difference (7) and the respective value difference (2) for the sensing channel CH2 is greater than that of the sensing channel CH1 (3=10−7) and than that of the sensing channel CH3 (2=9−7).

Since the ADC compensation is performed according to the DICs instead of according to the sensing channels, the changed sensed data Dsen1', Dsen2' and Dsen3' used for changing Data to Data', which are compensation data for luminance compensation for the corresponding subpixel, may not be accurate in some sensing channels (CH2 in the above calculation).

This may consequently prevent the data Data from being changed to the accurate compensation data Data', which are for luminance compensation for the subpixel, such that pixel compensation (luminance compensation) is not accurately performed.

Figure 16:
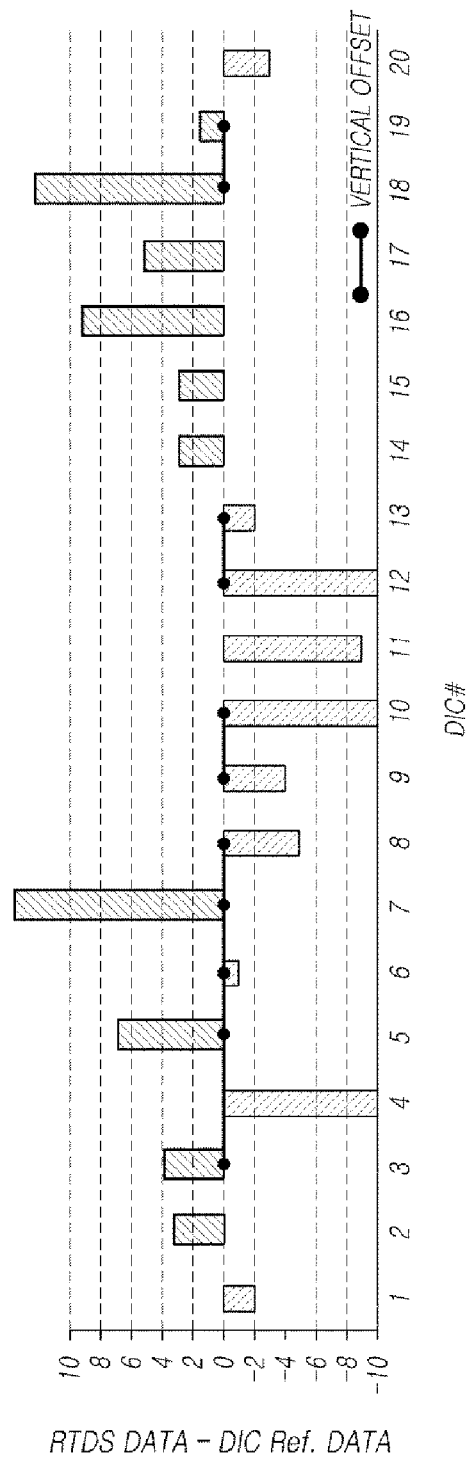
FIG. 16 and FIG. 17 are views illustrating the features of the first ADC method in the display device according to an exemplary embodiment.
Figure 17:
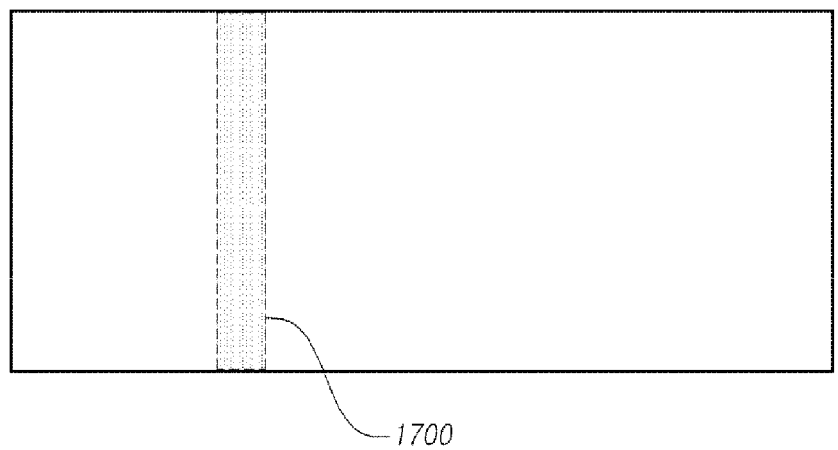

FIG. 16 and FIG. 17 are views illustrating the features of the first ADC method in the display device 100 according to an exemplary embodiment in order to demonstrate the drawback of the above-described first ADC compensation method.

FIG. 16 is a graph illustrating differences (RTDS Data−DIC Ref. Data) between average sensed data RTDS Data and reference data DIC Ref. Data according to the DICs.

Referring to FIG. 16, it is appreciated that there is a very significant difference between the difference obtained for DIC 3 (RTDS Data−DIC Ref. Data=4) and the difference obtained for DIC 4 (RTDS Data−DIC Ref. Data=−10).

It is appreciated that this phenomenon also occurs between DIC 4 and DIC 5, between DIC 5 and DIC 6, between DIC 6 and DIC 7, between DIC 9 and DIC 10, between DIC 12 and DIC 13 and between DIC 18 and DIC 19.

This phenomenon occurs since the ADC compensation is performed using the average values according to the DICs by disregarding the differences according to the sensing channels.

Consequently, in an area 1700 corresponding to a pixel row to which the data voltages are supplied from the DICs 200 where this phenomenon has occurred, the ADC characteristic or luminance may have a sudden change, or the resultant luminance may be brighter or darker than an intended level of luminance (see FIG. 17). This problem is referred to as a "vertical offset".

With reference to FIG. 18 to FIG. 23C, a description will be given below of the second ADC compensation method that performs ADC compensation according to the sensing channels by reflecting the differences according to the sensing channels unlike the first ADC compensation method as described above.

Figure 18:
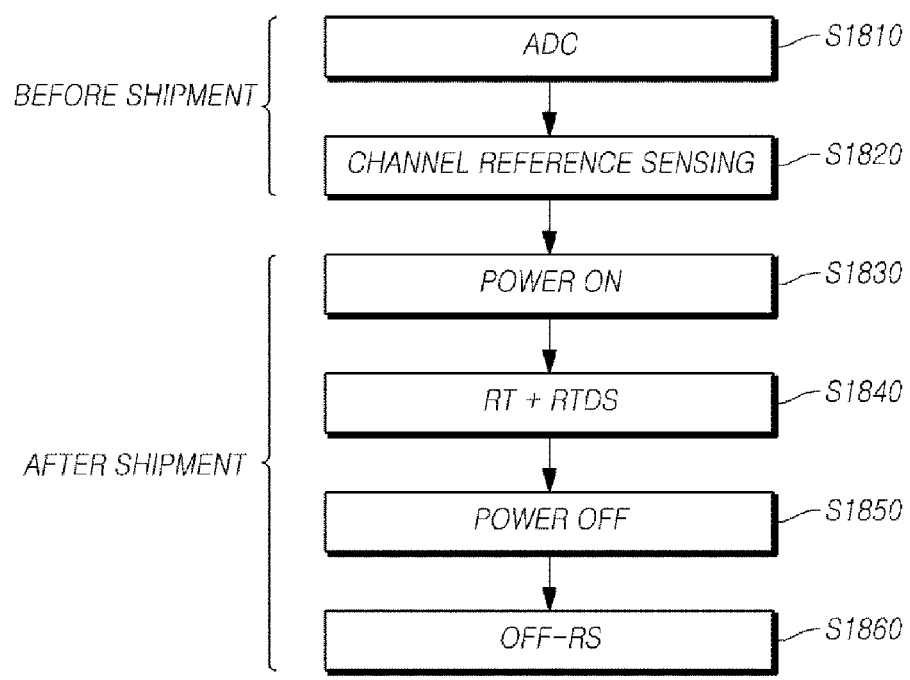
FIG. 18 is a flow diagram illustrating several sensing and compensation procedures using a second ADC compensation method in the display device according to an exemplary embodiment.

FIG. 18 is a flow diagram illustrating several sensing and compensation procedures using the second ADC compensation method in the display device 100 according to an exemplary embodiment.

Referring to FIG. 18, during fabrication before the display device 100 is shipped, the ADC 220 is sensed using a computer or the like and the lookup table 1020 for the compensation of a change (difference) in the ADC characteristic is generated (S1810). This process is referred to as "ADC variation compensation (AVC)".

The generated lookup table 1020 includes a lookup table generated in the voltage range for the threshold voltage sensing using a source meter (i.e. a lookup table for the threshold voltage sensing mode) and a lookup table generated in the voltage range for the mobility sensing (i.e. a lookup table for the mobility sensing).

The lookup table 1020 is stored in the memory 400.

Two pieces of sensing reference data according to the sensing channels (hereinafter referred to as "CH Ref. Data") for the threshold voltage sensing mode and the mobility sensing mode are generated instead of the DIC Ref. Data (S1820).

In this case, the averages of sensed data according to the sensing channels are obtained by repeatedly sensing the ADC 220 in the DIC 200 by an n number of times at intermediate voltages in the voltage ranges of the threshold voltage sensing mode and the mobility sensing mode. The averages obtained in this manner are the CH Ref. Data.

The CH Ref. Data are stored in the memory 400.

As described above, when the display device 100 is shipped, the lookup table 1020 including the ADC characteristic information (offset and gain) according to the sensing channels and the CH Ref. Data (also referred to as "Dref_avg") are stored in the memory 400 which is in the initialization state.

After the shipment of the display device 100, the display device 100 is powered on (S1830). Then, while the display device 100 is being powered on, the pixel compensation circuit 1010 within the timing controller 140 can perform real-time pixel compensation (RT compensation) such that the mobility of the transistor within each subpixel is compensated in real time (S1840).

At the step S1840, while the display device 100 is being powered on, the ADC compensation circuit 1000 can perform the ADC compensation (RTDS) by acquiring sensed data according to the sensing channels for one ADC 220, which is a component of each of the two or more DICs 200, and then updating the lookup table 1020 based on the difference (Dsen_ch−Dref_ch) between sensed data according to the sensing channels (Dsen_ch) and the CH Ref. Data (Dref_ch) for the same voltage. The ADC compensation (RTDS) can be performed before or after the pixel compensation (RT compensation) in which the pixel compensation circuit 1010 performs real-time compensation for the mobility of the transistor within each subpixel.

Referring to FIG. 18, at the step S1840, the real-time mobility compensation (RT compensation) and the real-time ADC compensation (RTDS) can be simultaneously performed while the display device 100 is being powered on.

As described above, the use of the second ADC compensation method makes it possible to compensate for the change in the ADC characteristic in real time by simultaneously performing the real-time mobility compensation (RT compensation) and the real-time ADC compensation while the display device 100 is being powered on.

Figure 19:
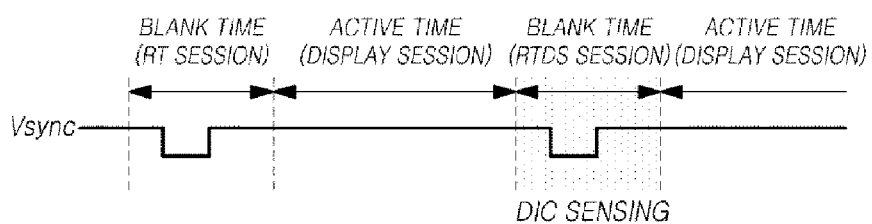
FIG. 19 and FIG. 20 are timing diagrams illustrating time sessions where ADC compensation and pixel compensation are performed in real time in the display device according to an exemplary embodiment.
Figure 20:
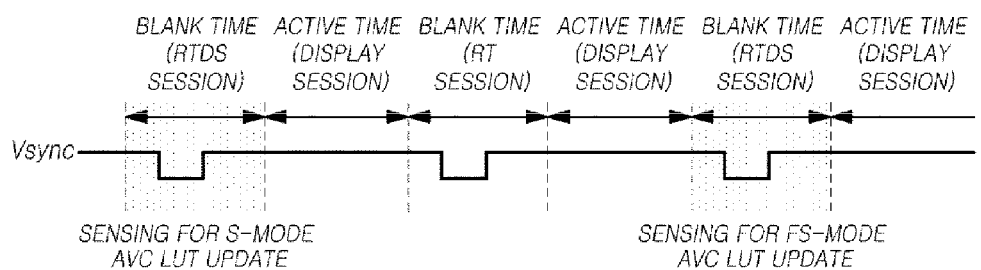

FIG. 19 and FIG. 20 are timing diagrams illustrating time sessions where the ADC compensation (RTDS) and the pixel compensation (RT compensation) are performed in real time in the display device according to an exemplary embodiment.

Referring to FIG. 19, the timing controller 140 can control the pixel compensation (RT compensation) and the ADC compensation (RTDS) for DIC sensing to be alternately performed during every blank time on a vertical synchronous signal while the display device 100 is being powered on.

As illustrated in FIG. 20, the timing controller 140 controls the pixel compensation (RT compensation) and the ADC compensation (RTDS) to be alternately performed during every blank time on the vertical synchronous signal. Here, in the ADC compensation (RTDS) performed during every blank time between the sessions where the RT compensation is performed, it is possible to alternately perform one sensing mode (ADC compensation) for updating the lookup table for the threshold voltage sensing mode S-Mode AVC LUT and the other sensing mode (ADC compensation) for updating the lookup table for the mobility sensing mode FS-Mode AVC LUT.

Referring to FIG. 18, a signal indicating that the display device 100 is powered off is generated (S1850). Then, the pixel compensation circuit 1010 can directly perform the pixel compensation (OFF RS) by referring to the lookup table 1020 that has been updated such that the threshold voltage of the transistor within each subpixel is compensated while the display device 100 is being powered on (S1860). Here, the step S1860 is performed without the ADC compensation (RTDS) unlike in the first ADC compensation method illustrated in FIG. 13.

Accordingly, it is possible to reduce the time in which the pixel compensation (OFF RS) is performed in response to the signal indicating that the display device 100 is powered off.

The ADC compensation (RTDS) performed at the above-described step S1840 will be described by way of example with reference to FIG. 21A and FIG. 21B.

Figure 21A:
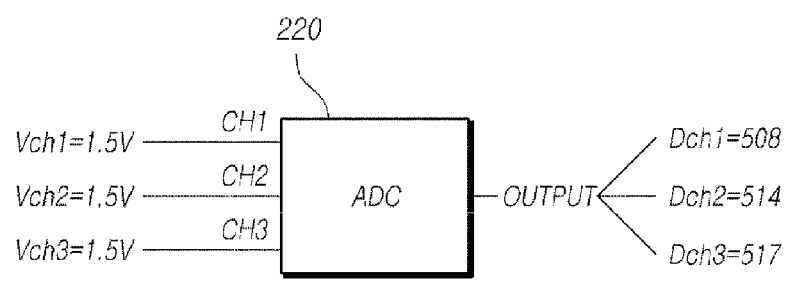
FIG. 21A and FIG. 21B are diagrams illustrating the second ADC compensation method performed in the display device according to an exemplary embodiment.
Figure 21B:
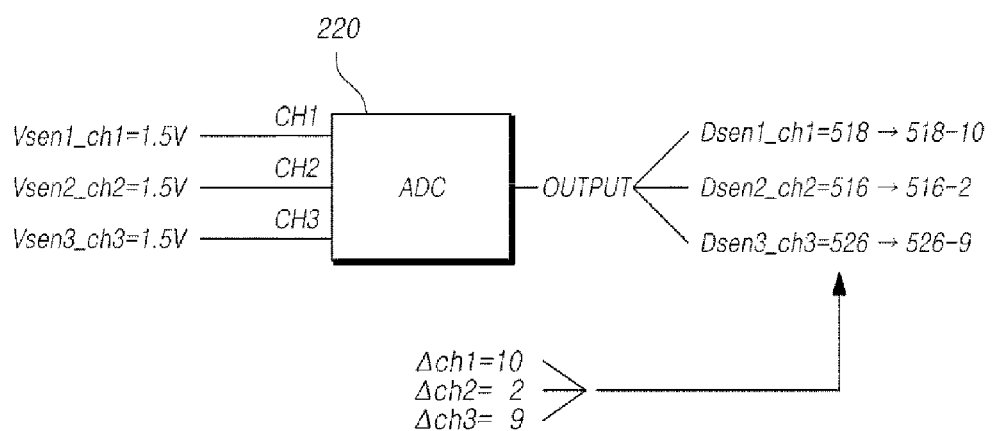

FIG. 21A and FIG. 21B are diagrams illustrating the second ADC compensation method performed in the display device according to an exemplary embodiment.

A description will be given of the generation of CH Ref. Data (also referred to as Dref_ch") with reference to FIG. 21A.

Referring to FIG. 21A, the same voltage (e.g. 1.5 V) is input through the three sensing channels CH1, CH2 and CH3 of the ADC 220, and three sets of sensed data Dch1, Dch2 and Dch3 output from the ADC 220 are obtained through the sensing channels, respectively. The averages of the sensed data according to the sensing channels are obtained by repeatedly performing this process by an n number of times.

The averages Dch1, Dch2 and Dch3 of the sensed data according to the sensing channels obtained as above are referred to as the CH Ref. Data.

Before shipment, the CH Ref. Data (Dch1, Dch2 and Dch3) are stored in the memory 400.

The above-described process is performed before the ADC compensation.

A description will be given of the ADC compensation (RTDS) with reference to FIG. 21B. The same voltage (e.g. 1.5 V) is applied to the ADC 220, and the ADC compensation circuit 1000 obtains three sets of sensed data Dsen1_ch1, Dsen2_ch2 and Dsen3_ch3 output from the ADC 220.

Referring to FIG. 21B, the ADC compensation circuit 1000 obtains the differences Δch1 (=Dsen1_ch1−Dch1=10), Δch2 (=Dsen2_ch2−Dch2=2) and Δch3 (=Dsen3_ch3−Dch3=9) between the three sets of sensed data Dsen1_ch1, Dsen2_ch2 and Dsen3_ch3 and the reference data Dch1, Dch2 and Dch3 according to the sensing channels.

The ADC compensation circuit 1000 updates the lookup table 1020 by adding or deducting the obtained differences Δch1, Δch2 and Δch3 to or from the ADC characteristic information (offset) according to the corresponding sensing channels of the lookup table 1020.

Then, during the OFF RS after the ADC compensation, provided the three sets of sensed data output from the ADC 220 through the conversion of the sensed voltages Vsen through the three sensing channels CH1, CH2 and CH3 be 518, 516 and 526, the three sets of sensed data are changed to 508 (=518−10), 514 (=516−2) and 517 (=526−9), respectively.

In this manner, since the changed sensed data are used when changing the data for the OFF RS (threshold voltage compensation), it is possible to more accurately reflect the change in the ADC characteristic when changing the data Data to the compensation data Data' used in compensation for the luminance of the corresponding subpixels.

Figure 22:
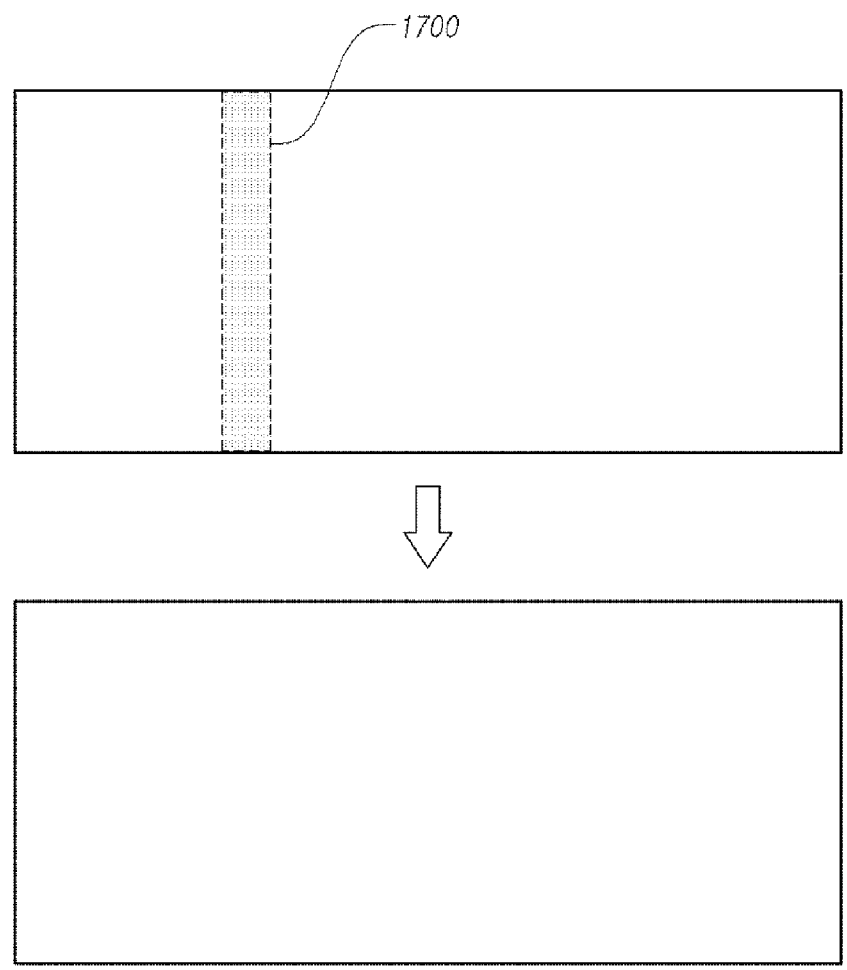
FIG. 22 is a diagram illustrating the features of the second ADC compensation method in the display device according to an exemplary embodiment.

As illustrated in the upper part of FIG. 22, the first ADC compensation method has a problem of vertical offset that occurs in the specific area 1700. In contrast, as illustrated in the lower part of FIG. 22, the second ADC compensation method can prevent or reduce the problem of vertical offset since the ADC compensation is performed according to the sensing channels.

FIG. 23A to FIG. 23C are diagrams illustrating the sequence of the sensing for the ADC compensation and the sensing for the pixel compensation in consideration of the colors of the subpixels in the display device according to an exemplary embodiment.

FIG. 23A is a diagram illustrating the display device 100 which is provided with a 3840×2160 number of pixels. Here, a single pixel consists of four subpixels (R, W, G and B). Therefore, the display device 100 has a 4×3840×2160 number of subpixels.

FIG. 23B and FIG. 23C are diagrams illustrating two examples of procedures for performing the sensing for the ADC compensation (RTDS) and the sensing for the mobility compensation (RT sensing) according to the second ADC compensation method while the display device 100 is being powered on. In this case, it should be considered that both the sensing for the ADC compensation (RTDS) and the sensing for the mobility compensation (RT sensing) cannot be simultaneously performed on a single subpixel, since both the sensing for the ADC compensation (RTDS) and the sensing for the mobility compensation (RT sensing) use the ADC 220.

Referring to FIG. 23B, the procedures can be performed by sensing all subpixels in a first line, sensing all subpixels in a second line, and then sensing all subpixels in a third line.

In this case, it is possible to perform the RTDS on a subpixel of one color in each line by changing the colors Consequently, the RTDS is performed on the entire sensing lines.

Specifically, in the first line, the RTDS is performed on an R subpixel R1, followed by the RT performed on a W subpixel W1, the RT performed on a G subpixel G1, and finally the RT performed on a B subpixel B1.

Afterwards, in the second line, the RT is performed on an R subpixel R2, followed by the RTDS performed on a W subpixel W2, the RT performed on a G subpixel G2, and finally the RT performed on a B subpixel B2.

After that, in the third line, the RT is performed on an R subpixel R3, followed by the RT performed in a W subpixel W3, the RTDS performed on a G subpixel G3, and finally the RT performed on a B subpixel B3.

Finally, in a fourth line, the RT is performed on an R subpixel R4, followed by the RT performed on a W subpixel W4, the RT performed on a G subpixel G4, and finally the RTDS performed on a B subpixel B4.

Referring to FIG. 23C, the procedures can be performed by sensing one group of subpixels of one color and then sensing another group of subpixels of another color.

In this case, it is possible to perform the RTDS on a subpixel of one color in each line by changing the colors. Consequently, the RTDS is performed on the entire sensing lines.

Specifically, the RTDS is performed on a red subpixel R1 in the first line, followed by the RT performed on a red subpixel R2 in the second line, the RT performed on a red subpixel R3 in the third line, the RT performed on a red subpixel R4 in the fourth line, and finally the RT performed on a red subpixel R2160 in the 2160$^{th}$ line.

Afterwards, the RT is performed on a white subpixel W1 in the first line, followed by the RTDS performed on a white subpixel W2 in the second line, the RT performed on a white subpixel W3 in the third line, the RT performed on a white subpixel W4 in the fourth line, and finally the RT performed on a white subpixel W2160 in the 2160$^{th}$ line.

After that, the RT is performed on a green subpixel G1 in the first line, followed by the RT performed on a green subpixel G2 in the second line, the RTDS performed on a green subpixel G3 in the third line, the RT performed on a green subpixel G4 in the fourth line, and finally the RT performed on a green subpixel G2160 in the 2160$^{th}$ line.

Finally, the RT is performed on a blue subpixel B1 in the first line, followed by the RT performed on a blue subpixel B2 in the second line, the RT performed on a blue subpixel B3 in the third line, the RTDS performed on a blue subpixel B4 in the fourth line, and finally the RT performed on a blue subpixel B2160 in the 2160$^{th}$ line.

Referring to FIG. 23A and FIG. 23B, some subpixels are sensed by the DIC 200, i.e. subjected to the RTDS compensation. Since these subpixels are not subjected to the RT compensation, the previously-performed RT compensation values of these subpixels are maintained until the next RT compensation is performed.

Briefly describing the features of the display device 100 according to an exemplary embodiment as set forth above, the display device 100 includes the display panel 110 on which the data lines and the gate lines are formed, as well as the DICs 200 and the timing controller 140. The DICs 200 convert voltages sensed in sensing nodes within subpixels into digital sensed data through the ADCs 220 and output the sensed data. The timing controller 140 changes the sensed data in response to a change in the ADC characteristic, changes image data based on the changed sensed data, and supplies the changed image data to the DICs 200.

The display device 100 according to an exemplary embodiment can be implemented as any one selected from among, but not limited to, liquid crystal displays (LCDs), plasma display panels (PDPs) and organic light-emitting diode (OLED) display devices as long as they include the ADCs 200.

Figure 24:
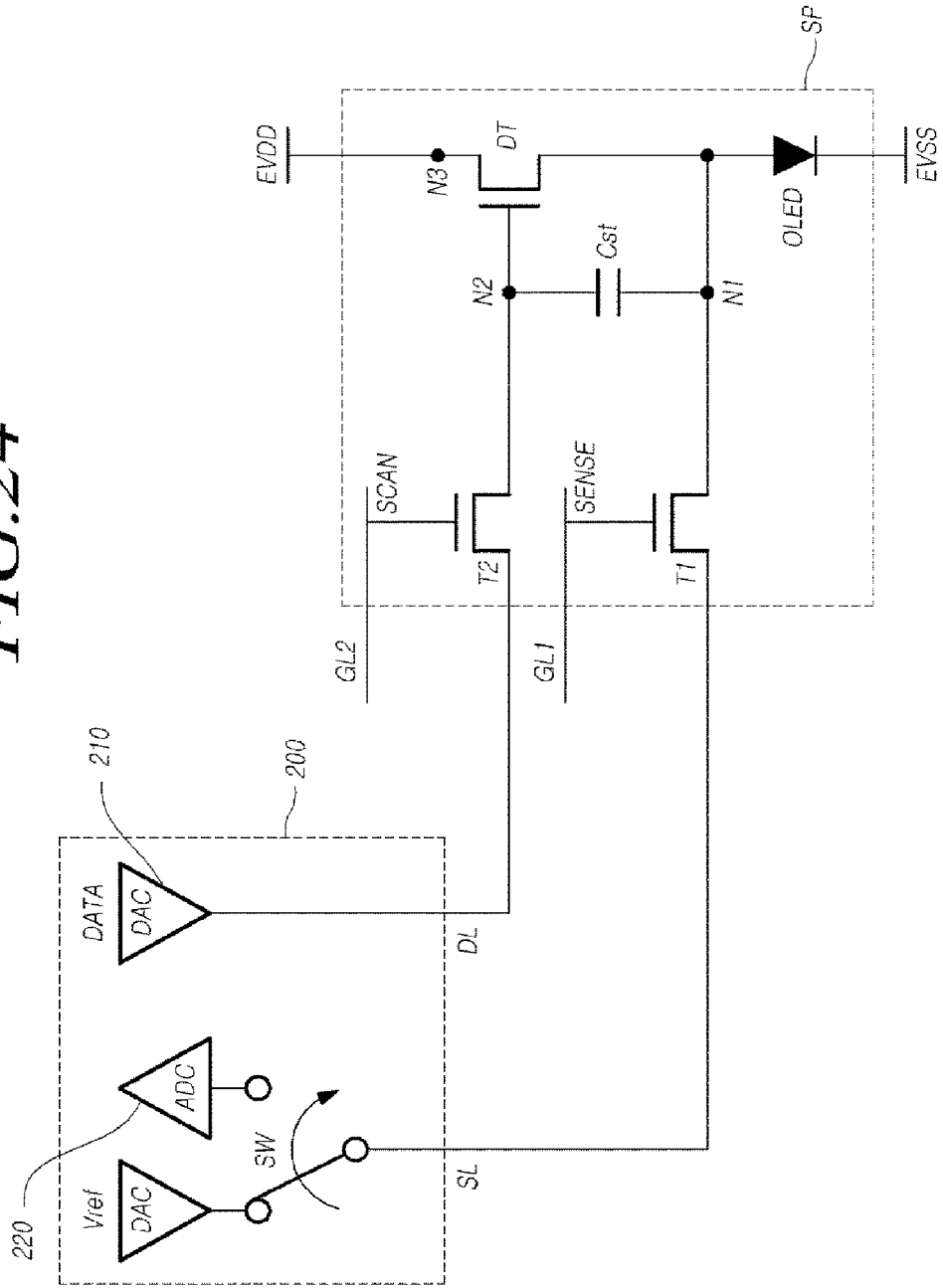
FIG. 24 is a diagram illustrating a subpixel structure, an ADC and a sensing line when the display device according to an exemplary embodiment is an OLED display device.

FIG. 24 is a diagram illustrating a subpixel structure, an ADC and a sensing line when the display device 100 according to an exemplary embodiment is an OLED display device.

Referring to FIG. 24, when the display device 100 according to an exemplary embodiment is an OLED display device, each of the subpixels includes an OLED, a driving transistor DT, a first transistor T1, a second transistor T2 and a capacitor Cst. The driving transistor DT drives the OLED. The first transistor T1 is controlled by a first scanning signal SENSE supplied through a first gate line GL1, and is connected between a line SL serving as a reference voltage line through which a reference voltage is supplied or a sensing line and an N1 node (source or drain node) of the driving transistor DT. The second transistor T2 is controlled by a second scanning signal SCAN supplied through a second gate line GL2, and is connected between a data line DL and an N2 node (gate node) of the driving transistor DT. The capacitor Cst is connected between the N1 node and the N2 node of the driving transistor DT.

Referring to FIG. 24, when the second transistor T2 is turned on, the second transistor T2 applies a data voltage Vdata supplied through the DIC 200 to the N2 node (gate node) of the driving transistor DT.

Referring to FIG. 24, when the first transistor T1 is turned on, the first transistor T1 applies a reference voltage Vref supplied through the line SL to the N1 node (source or drain node) of the driving transistor DT. Here, the line SL serves as a reference voltage line.

In addition, the first transistor T1 is turned on according to the switching operation SW, and allows a voltage in the N1 node of the driving transistor DT to be applied to the line SL, such that the ADC 220 within the DIC 200 can sense the voltage in the N1 node of the driving transistor DT. Here, the line SL serves as a sensing line, and the N1 node of the driving transistor serves as a sensing node.

One line SL, as illustrated in FIG. 24, can be provided in each row of four subpixel rows (R, W, G and B).

According to the present invention as set forth above, it is possible to overcome the problem in that the luminance of each subpixel is not compensated or the difference in the levels of luminance between the subpixels is not compensated although the pixel compensation function is provided.

In addition, according to the present invention, although the result of sensing the sensing nodes within each subpixel is not accurate, the sensing result is compensated, thereby making the pixel compensation using the sensing result be accurate. This can consequently prevent or reduce the non-uniformity of luminance, thereby improving the image quality of the display device 100.

Furthermore, according to the present invention, the ADC compensation technology capable of compensating for a change in the ADC characteristic is provided. When the characteristics of the ADC 220 corresponding to the sensing unit has changed, the pixel compensation using the ADC sensing result.

In addition, according to the present invention, the ADC compensation function efficiently compensates for a change in the ADC characteristic according to the DICs when the ADC characteristic has changed.

Furthermore, according to the present invention, the ADC compensation function accurately compensates for a change in the ADC characteristic according to the sensing channels when the ADC characteristic has changed.

The foregoing descriptions and the accompanying drawings have been presented in order to explain the certain principles of the present invention. A person skilled in the art to which the invention relates can make many modifications and variations by combining, dividing, substituting for or changing elements without departing from the principle of the invention. The foregoing embodiments disclosed herein shall be interpreted as illustrative only not as limitative of the principle and scope of the invention. It should be understood that the scope of the invention shall be defined by the appended Claims and all of their equivalents fall within the scope of the invention.

What is claimed is:

1. A display device comprising:
    a display panel having data lines, gate lines and a plurality of subpixels, wherein each of the plurality of subpixels are defined by the data lines and the gate lines, and each of the plurality of subpixels includes a circuit having a transistor;
    a plurality of Digital Integrated Circuits (DICs);
    a digital to analog converter (DAC) disposed within each of the plurality of DICs;
    an analog to digital converter (ADC) disposed within each of the plurality of DICS, wherein the ADC disposed in each of the plurality of DICs includes a plurality of sensing channels;
    a memory having a lookup table (LUT);
    a timing controller, wherein the timing controller changes data supplied to the subpixels according to the LUT;
    a pixel compensation circuit to compensate a characteristic of the transistor within each of the plurality of subpixels; and
    an ADC compensation circuit to compensate a characteristic of the ADC within each of the plurality of DICs.

2. The display device of claim 1, wherein the ADC characteristic information includes offset.

3. The display device of claim 1, wherein the ADC characteristic information includes gain.

4. The display device of claim 1, wherein the characteristic of the transistor includes mobility.

5. The display device of claim 1, wherein the characteristic of the transistor includes threshold voltage.

6. A method of driving a display device having a display panel having data lines, gate lines and a plurality of subpixels, wherein each of the plurality of subpixels are defined by the data lines and the gate lines, and each of the plurality of subpixels includes a circuit having a transistor; a plurality of Digital Integrated Circuits (DICs); a digital to analog converter (DAC) disposed within each of the plurality of DICs; an analog to digital converter (ADC) disposed within each of the plurality of DICs, wherein the ADC disposed in each of the plurality of DICs includes a plurality of sensing channels; a memory having a lookup table (LUT); a timing controller, wherein the timing controller changes data supplied to the subpixels according to the LUT; a pixel compensation circuit to compensate a characteristic of the transistor within each of the plurality of subpixels; and an ADC compensation circuit to compensate a characteristic of the ADC within each of the plurality of DICs, the method comprising:
    updating the LUT to include ADC characteristic information according to each of the plurality of sensing channels, wherein the ADC characteristic information includes offset and gain;
    updating the LUT to include a Reference Data Average, wherein the Reference Data Average is calculated by sensing the ADC reference data according to each of the plurality of sensing channels and averaging the sensed ADC reference data;
    compensating a mobility of the transistor within each of the plurality of subpixels in real time;
    compensating a characteristic of each ADC disposed within each of the plurality of DICs;
    compensating a threshold voltage of the transistor within each of the plurality of subpixels.

7. The method of driving the display device of claim 6, wherein compensating a characteristic of each ADC comprises:
    sensing the ADC data according to each of the plurality of sensing channels of each ADC disposed in each of the plurality of DICs to generate Sensed Data;
    averaging the Sensed Data to generate a Sensed Data Average; and
    calculating a difference between the Reference Data Average and the Sensed Data Average.

8. The method of driving the display device of claim 7, further comprising, updating the LUT by adding or subtracting the difference to or from the ADC characteristic information.

9. The method of driving the display device of claim 7, further comprising:
    subtracting the difference between the Reference Data Average and the Sensed Data Average from the Sensed Data of each of the plurality of sensing channels of each ADC disposed in each of the plurality of DICs to generate a Changed Sensed Data for each of the plurality of sensing channels of each ADC.

10. The method of driving the display device of claim 9, wherein the Changed Sensed Data is used to compensate a threshold voltage of the transistor within each of the plurality of subpixels.

11. The method of driving the display device of claim 6, wherein the mobility of the transistor within each of the plurality of subpixels is compensated in real time when the display device is powered on.

12. The method of driving the display device of claim 6, wherein the characteristic of each ADC is compensated when the display device is powered off.

13. The method of driving the display device of claim 6, wherein the threshold voltage of the transistor within each of the plurality of subpixels is compensated after the ADC compensation step.

14. A method of driving a display device having a display panel having data lines, gate lines and a plurality of subpixels, wherein each of the plurality of subpixels are defined by the data lines and the gate lines, and each of the plurality of subpixels includes a circuit having a transistor; a plurality of Digital Integrated Circuits (DICs); a digital to analog converter (DAC) disposed within each of the plurality of DICs; an analog to digital converter (ADC) disposed within each of the plurality of DICs, wherein the ADC disposed in each of the plurality of DICs includes a plurality of sensing channels; a memory having a lookup table (LUT); a timing controller, wherein the timing controller changes data supplied to the subpixels according to the LUT; a pixel compensation circuit to compensate a characteristic of the transistor within each of the plurality of subpixels; and an ADC compensation circuit to compensate a characteristic of the ADC within each of the plurality of DICs, the method comprising:

sensing ADC reference data for each of the plurality of sensing channels of each ADC disposed in each of the plurality of DICs;

compensating a mobility of the transistor within each of the plurality of subpixels in real time;

compensating a characteristic of each ADC sensing channel disposed within each of the plurality of DICs;

compensating a threshold voltage of the transistor within each of the plurality of subpixels.

15. The method of driving the display device of claim 14, wherein compensating a characteristic of each ADC sensing channel comprises:

sensing the ADC data according to each of the plurality of sensing channels of each ADC disposed in each of the plurality of DICs to generate Sensed Data; and calculating a difference between the Sensed Data and the sensed ADC reference data for each of the plurality of sensing channels of each ADC disposed in each of the plurality of DICs.

16. The method of driving the display device of claim 15 further comprising, updating the LUT by adding or subtracting the difference to or from ADC characteristic information of each of the plurality of sensing channels, wherein the ADC characteristic information includes offset or gain.

17. The method of driving the display device of claim 16, further comprising:

subtracting the difference between the Sensed Data and the ADC reference data from the Sensed Data of each of the plurality of sensing channels to generate a Changed Sensed Data for each of the plurality of sensing channels.

18. The method of driving the display device of claim 17, wherein the Changed Sensed Data is used to compensate a threshold voltage of the transistor within each of the plurality of subpixels.

19. The method of driving the display device of claim 14, further comprising simultaneously compensating a mobility of the transistor and compensating the characteristic of each ADC sensing channel disposed within each of the plurality of DICs when the display device is powered on.

20. The method of driving the display device of claim 14, further comprising compensating the threshold voltage of the transistor within each of the plurality of subpixels when the display device is powered off.

* * * * *